United States Patent
Stoib et al.

(10) Patent No.: US 10,868,159 B2
(45) Date of Patent: Dec. 15, 2020

(54) POWER SEMICONDUCTOR DEVICE

(71) Applicant: Infineon Technologies AG, Neubiberg (DE)

(72) Inventors: Benedikt Stoib, Feldkirchen-Westerham (DE); Hans-Joachim Schulze, Taufkirchen (DE); Max Christian Seifert, Schliersee (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/413,815

(22) Filed: May 16, 2019

(65) Prior Publication Data
US 2019/0355841 A1   Nov. 21, 2019

(30) Foreign Application Priority Data
May 17, 2018  (DE) .................. 10 2018 111 939

(51) Int. Cl.
*H01L 29/739*    (2006.01)
*H01L 29/10*    (2006.01)
*H01L 29/08*    (2006.01)

(52) U.S. Cl.
CPC ...... *H01L 29/7397* (2013.01); *H01L 29/0804* (2013.01); *H01L 29/1095* (2013.01)

(58) Field of Classification Search
None
See application file for complete search history.

(56) References Cited

U.S. PATENT DOCUMENTS

| | | | | |
|---|---|---|---|---|
| 5,585,651 A | * | 12/1996 | Kitagawa | H01L 29/7394 257/135 |
| 6,936,893 B2 | * | 8/2005 | Tanaka | H01L 29/0619 257/133 |
| 2005/0035405 A1 | | 2/2005 | Mauder et al. | |
| 2008/0169526 A1 | * | 7/2008 | Wakimoto | H01L 29/7813 257/490 |
| 2016/0240615 A1 | * | 8/2016 | Tutuc | H01L 29/66681 |

* cited by examiner

*Primary Examiner* — Lex H Malsawma
(74) *Attorney, Agent, or Firm* — Murphy, Bilak & Homiller, PLLC

(57) ABSTRACT

A power semiconductor device includes a semiconductor body having a front side coupled to a first load terminal structure and a backside coupled to a second load terminal structure. A front side structure arranged at the front side is at least partially included in the semiconductor body and defines a front side active region configured to conduct a load current between the load terminal structures. The front side structure includes first and second lateral edge portions and a first corner portion that forms a transition between the lateral edge portions. A drift region included in the semiconductor body is configured to carry the load current. A backside emitter region arranged in the semiconductor body in contact with the second load terminal has a net dopant concentration higher than a net dopant concentration of the drift region.

19 Claims, 12 Drawing Sheets

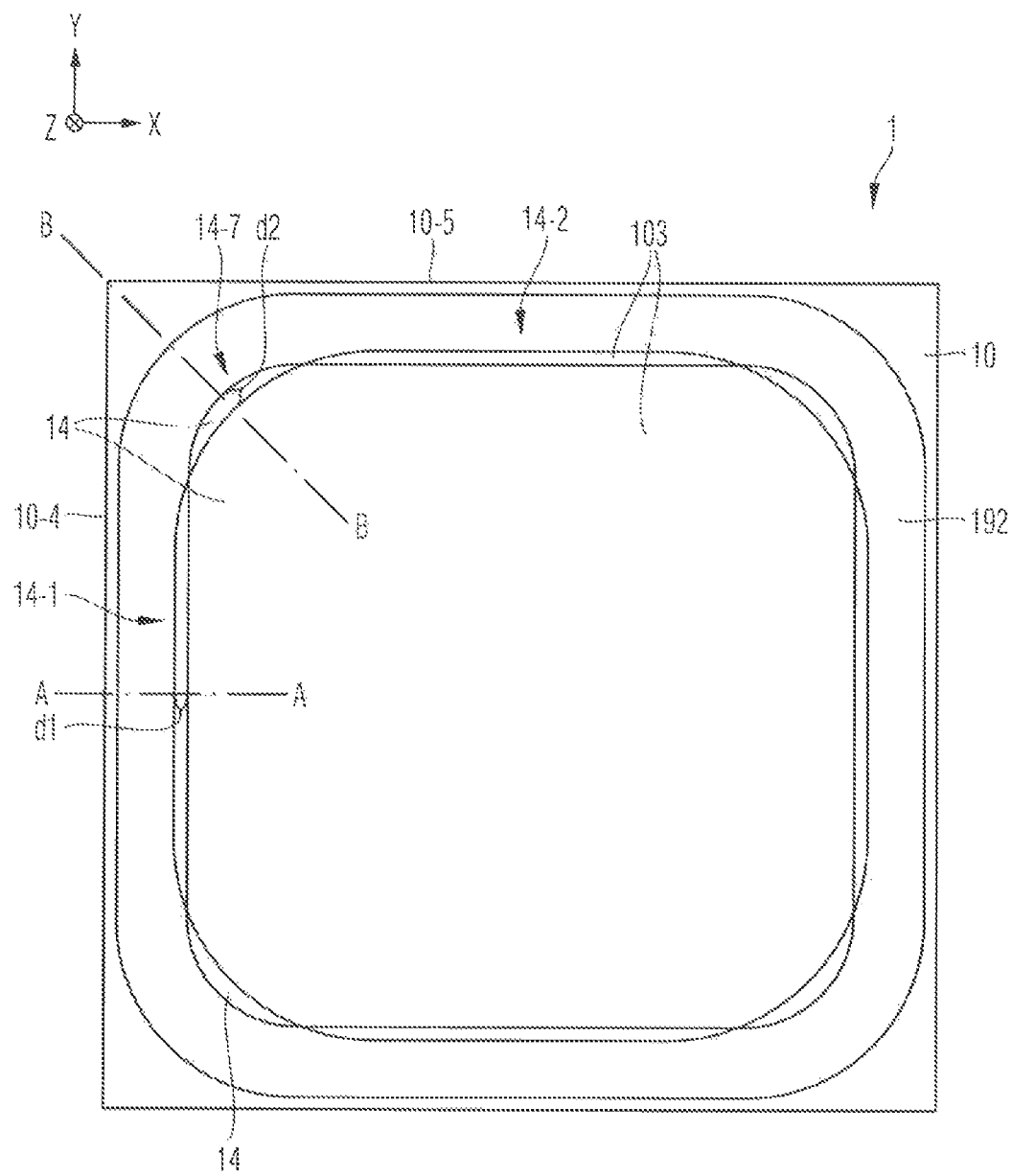

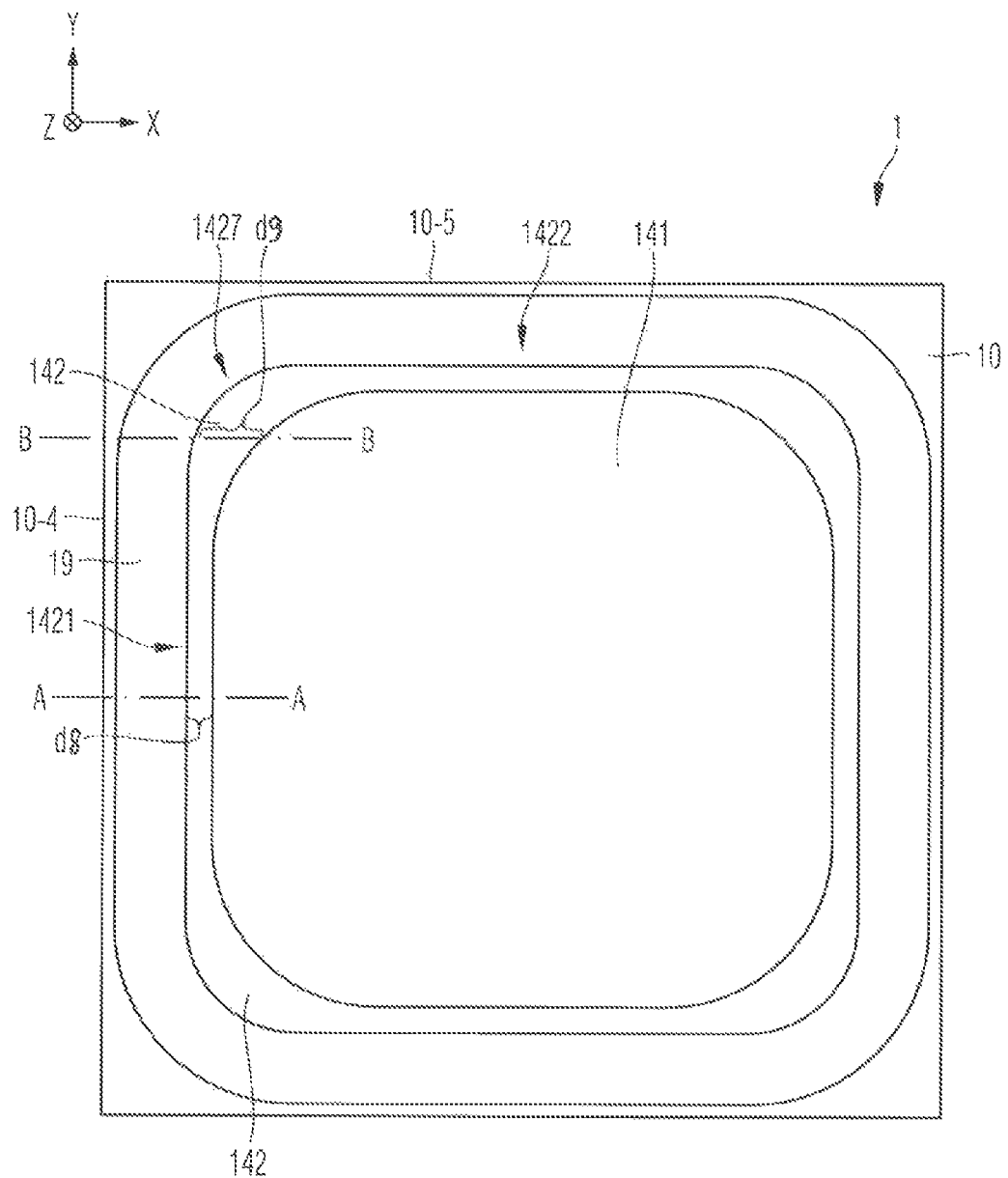

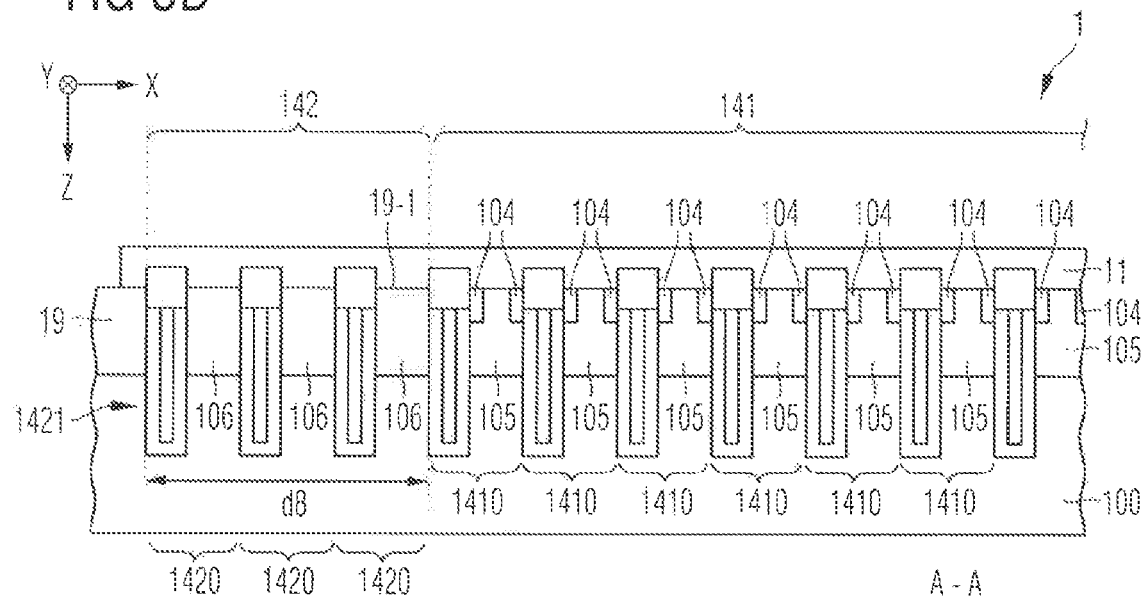
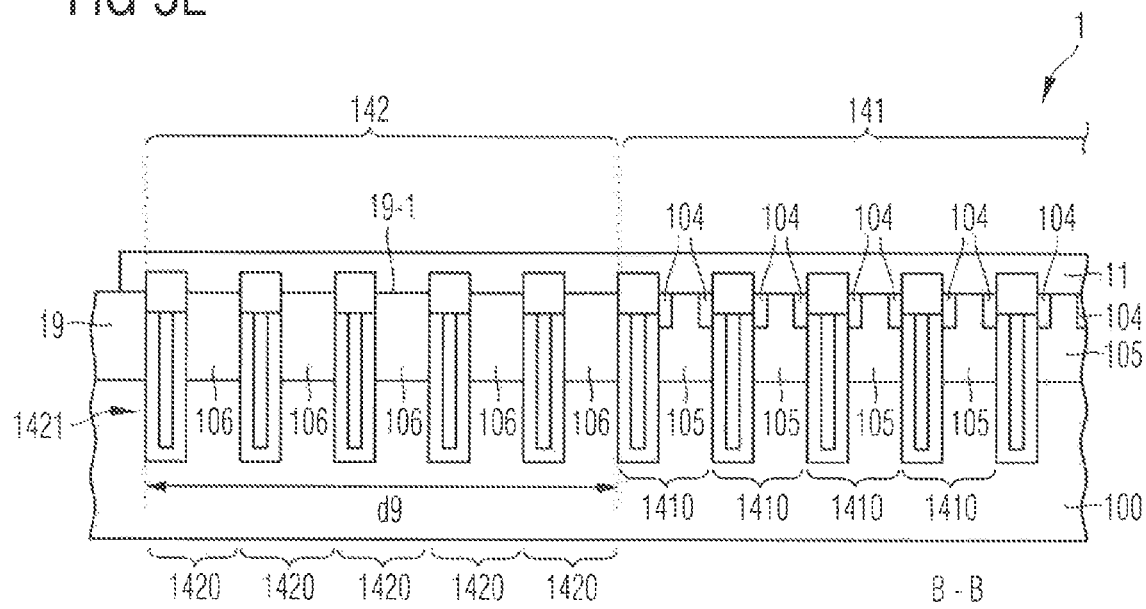

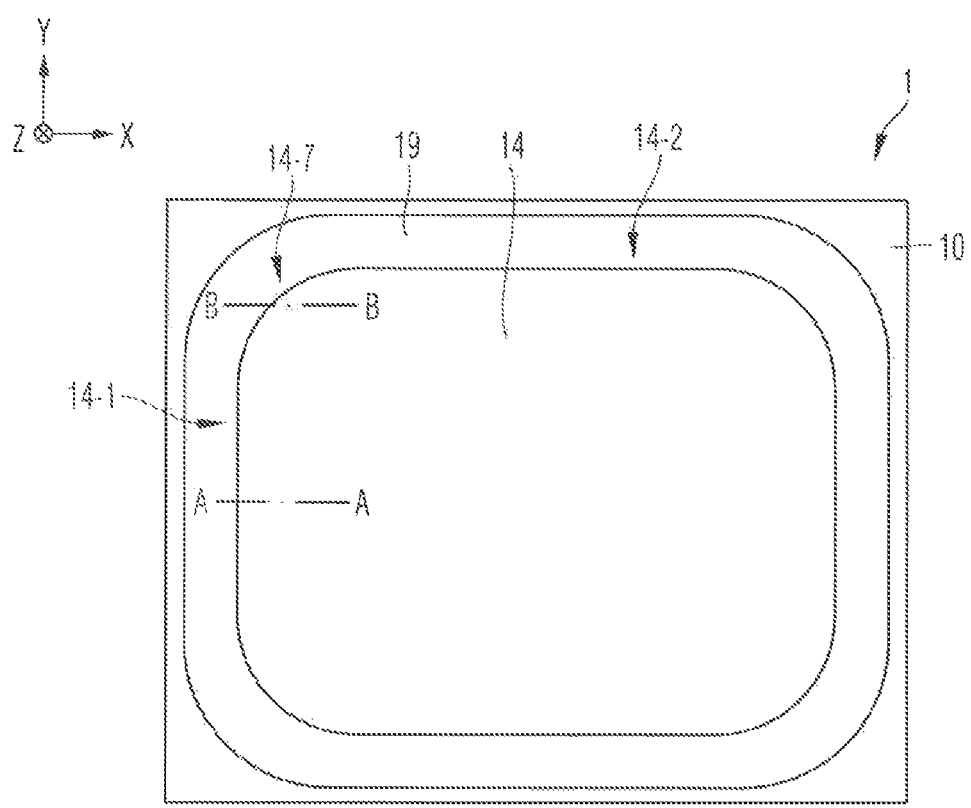

POWER SEMICONDUCTOR DEVICE

TECHNICAL FIELD

This specification refers to embodiments of a power semiconductor device. In particular, this specification relates to embodiments of a power semiconductor device, such as a diode or an IGBT, having a front side structure that defines a front side active region, wherein the front side structure exhibits a corner.

BACKGROUND

Many functions of modern devices in automotive, consumer and industrial applications, such as converting electrical energy and driving an electric motor or an electric machine, rely on power semiconductor devices. For example, insulated gate bipolar transistors (IGBTs), metal oxide semiconductor field effect transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state.

Further, for conducting the load current, the power semiconductor device may comprise a front side structure which may define a so-called front side active region of the power semiconductor device. For example, the front side structure may comprise one or more power cells, such as IGBT cells, or an anode region of a power diode. Such a front side structure may exhibit one or more corner portions forming a transition between respective lateral edge portions of the front side structure. Further, a drift region and a backside emitter region may be provided inside a semiconductor body of the power semiconductor device, wherein the backside emitter region may comprise dopants at a higher dopant concentration than the drift region. For example, the backside emitter region may be configured for injecting charge carriers into the drift region in a conducting state of the power semiconductor device. The drift region may comprise a field stop region having a higher dopant concentration than portions of the drift regions external of the field stop region.

It is a general purpose to increase the dynamic robustness of such power semiconductor devices, such as during switch-off. For example, it is therefore generally desirable to reduce a charge carrier density in the vicinity of an edge portion so as to limit dynamic avalanche and/or avoid latch-up. At the same time, it should be avoided that measures for increasing robustness are at the expense of a substantial increase of on-state losses, e.g., due to a smaller backside active area, i.e. a backside emitter in the case of an IGBT or a cathode region in the case of a diode.

SUMMARY

According to an embodiment, the power semiconductor device comprises: A semiconductor body having a front side coupled to a first load terminal structure and a backside coupled to a second load terminal structure; a front side structure being arranged at the front side and being at least partially included in the semiconductor body, the front side structure defining a front side active region that is configured for conducting a load current between the first load terminal structure and the second load terminal structure in a conducting state of the power semiconductor device, wherein the front side structure exhibits a first lateral edge portion, a second lateral edge portion, and a first corner portion that forms a transition between the first lateral edge portion and the second lateral edge portion; a drift region of a first conductivity type being included in the semiconductor body and being configured for carrying the load current; and a backside emitter region being arranged in the semiconductor body in contact with the second load terminal, the emitter region having a net dopant concentration that is higher than a net dopant concentration of the drift region. In a vertical projection, the backside emitter region laterally terminates at a first distance from the first lateral edge portion and/or the second lateral edge portion and at a second distance from the first corner portion, wherein the second distance is larger than the first distance.

According to another embodiment, a power semiconductor device comprises: a semiconductor body having a front side coupled to a first load terminal structure and a backside coupled to a second load terminal structure; a front side structure being arranged at the front side and being at least partially included in the semiconductor body, wherein the front side structure is a cell field comprising a plurality of IGBT cells, thereby defining a front side active region that is configured for conducting a load current between the first load terminal structure and the second load terminal structure in a conducting state of the power semiconductor device. The front side structure exhibits: a recess defining a pad region that is provided for arranging a contact pad at the front side; a third lateral edge portion extending alongside the pad region, a fourth lateral edge portion extending alongside the pad region, and a second corner portion that forms a transition between the third lateral edge portion and the fourth lateral edge portion; The power semiconductor device further comprises a drift region of a first conductivity type being included in the semiconductor body and being configured for carrying the load current; and a backside emitter region being arranged in the semiconductor body in contact with the second load terminal, the emitter region having a net dopant concentration that is higher than a net dopant concentration of the drift region. In a vertical projection, an overlap of the pad region and the backside emitter region laterally terminates at a third distance from the third lateral edge portion and/or the fourth lateral edge portion and at a fourth distance from the second corner portion, wherein the fourth distance is larger than the third distance.

According to a further embodiment, a power semiconductor device comprises: A semiconductor body having a front side coupled to a first load terminal structure and a backside coupled to a second load terminal structure; a front side structure being arranged at the front side and being at least partially included in the semiconductor body, the front side structure defining a front side active region that is configured for conducting a load current between the first load terminal structure and the second load terminal structure in a conducting state of the power semiconductor device, wherein the front side structure exhibits a first lateral edge portion, a second lateral edge portion, and a first corner portion that forms a transition between the first lateral edge portion and the second lateral edge portion; a drift region of a first conductivity type being included in the semiconductor body and being configured for carrying the load current; and a field stop region being included in the drift region and having dopants of the first conductivity type at a higher dopant concentration than the drift region external of the field stop region. The field stop region comprises an inner region and an outer region, the outer region being arranged closer to the first lateral edge portion, the second lateral edge portion, and the first corner portion than the inner region and having dopants of the first conductivity type at a higher dopant concentration than the inner region. In the vicinity of the first corner portion, the outer region extends further into the front side active region than in the vicinity of each of the first lateral edge portion and the second lateral edge portion.

According to a further embodiment, a power semiconductor device comprises: A semiconductor body having a front side coupled to a first load terminal structure and a backside coupled to a second load terminal structure; a front side structure being arranged at the front side and being at least partially included in the semiconductor body, the front side structure defining a front side active region that is configured for conducting a load current between the first load terminal structure and the second load terminal structure in a conducting state of the power semiconductor device, wherein the front side structure exhibits a first lateral edge portion, a second lateral edge portion, and a first corner portion that forms a transition between the first lateral edge portion and the second lateral edge portion; a drift region of a first conductivity type being included in the semiconductor body and being configured for carrying the load current; and a field stop region being included in the drift region and having dopants of the first conductivity type at a higher dopant concentration than the drift region external of the field stop region. The field stop region comprises an inner region and an outer region, the outer region being arranged closer to the first lateral edge portion, the second lateral edge portion, and the first corner portion than the inner region and having dopants of the first conductivity type at a lower dopant concentration than the inner region. In the vicinity of the first corner portion, the outer region extends further into the front side active region than in the vicinity of each of the first lateral edge portion and the second lateral edge portion.

According to a further embodiment, a power semiconductor device comprises: A semiconductor body having a front side coupled to a first load terminal structure and a backside coupled to a second load terminal structure; a front side structure being arranged at the front side and being at least partially included in the semiconductor body, the front side structure defining a front side active region that is configured for conducting a load current between the first load terminal structure and the second load terminal structure in a conducting state of the power semiconductor device, wherein the front side structure exhibits a first lateral edge portion, a second lateral edge portion, and a first corner portion that forms a transition between the first lateral edge portion and the second lateral edge portion; and a drift region of a first conductivity type being included in the semiconductor body and being configured for carrying the load current. A lifetime of charge carriers in the drift region is shorter in the vicinity of the first corner portion than in the vicinity of each of the first lateral edge portion and the second lateral edge portion.

According to yet another embodiment, a power semiconductor device comprises: A semiconductor body having a front side coupled to a first load terminal structure and a backside coupled to a second load terminal structure; and a front side structure being arranged at the front side and being at least partially included in the semiconductor body. The front side structure comprises: An active cell field comprising a plurality of IGBT cells, each IGBT cell comprising a source region of a first conductivity type and a body region of a second conductivity type complementary to the first conductivity type; and a drainage structure comprising a plurality of drainage cells, each drainage cell comprising a drainage region of the second conductivity type that is arranged in contact with the first load terminal structure. Each drainage cell does not comprise a source region of the first conductivity type being arranged in contact with the first load terminal structure. The drainage structure is arranged laterally in between the active cell field and an edge termination region of the semiconductor device and exhibits a first outer edge portion, a second outer edge portion, and an outer corner portion that forms a transition between the first outer edge portion and the second outer edge portion. A minimal distance between the active cell field and the outer corner portion is larger than a minimal distance between the active cell field and each of the first outer edge portion and the second outer edge portion.

Those skilled in the art will recognize additional features and advantages upon reading the following detailed description, and upon viewing the accompanying drawings.

BRIEF DESCRIPTION OF THE DRAWINGS

The parts in the Figures are not necessarily to scale, emphasis being instead placed upon illustrating principles of the invention. Moreover, in the Figures, like reference numerals designate corresponding parts. In the drawings:

FIG. 3A schematically and exemplarily illustrates a section of a vertical projection of a power semiconductor device in accordance with one or more embodiments;

FIG. 5A schematically and exemplarily illustrates a section of a vertical projection of a power semiconductor device in accordance with one or more embodiments;

FIG. 5D is an enlarged view of a section of the vertical cross-section of FIG. 5B;

FIG. 5E is an enlarged view of a section of the vertical cross-section of FIG. 5C;

FIG. 6A schematically and exemplarily illustrates a section of a vertical projection of a power semiconductor device in accordance with one or more embodiments;

DETAILED DESCRIPTION

Figure 1A:
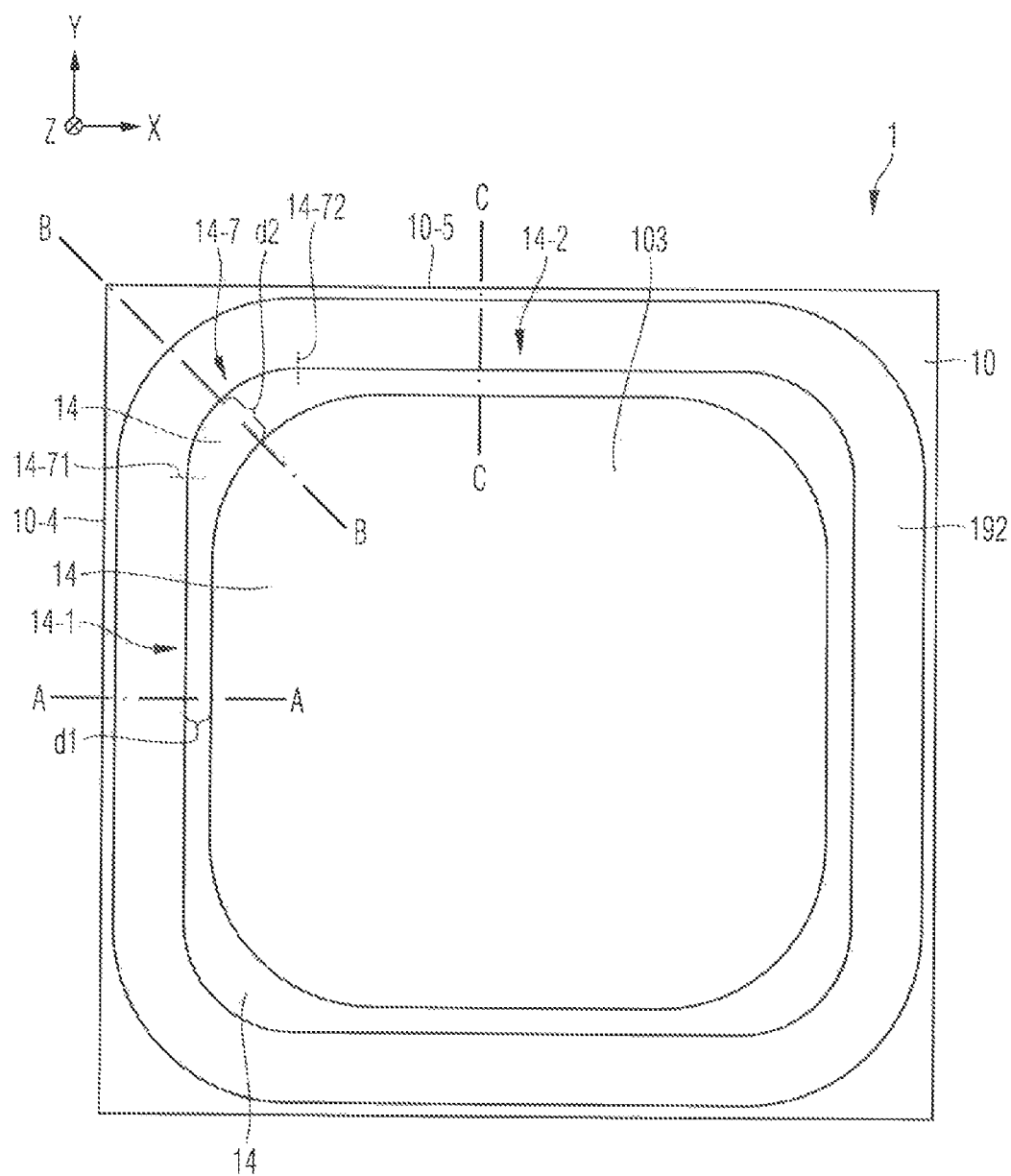
FIG. 1A schematically and exemplarily illustrates a section of a vertical projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "below", "above" etc., may be used with reference to the orientation of the Figures being described. Because parts of embodiments can be positioned in a number of different orientations, the directional terminology is used for purposes of illustration and is in no way limiting. It is to be understood that other embodiments may be utilized, and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the Figures. Each example is provided by way of explanation and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer.

For example, the extension direction Z mentioned below may be an extension direction that is perpendicular to both the first lateral direction X and the second lateral direction Y.

In this specification, n-doped is referred to as "first conductivity type" while p-doped is referred to as "second conductivity type". Alternatively, opposite doping relations can be employed so that the first conductivity type can be p-doped, and the second conductivity type can be n-doped.

Further, within this specification, the term "dopant concentration" may refer to an average dopant concentration or, respectively, to a mean dopant concentration or to a sheet charge carrier concentration of a specific semiconductor region or semiconductor zone. Thus, e.g., a statement saying that a specific semiconductor region exhibits a certain dopant concentration that is higher or lower as compared to a dopant concentration of another semiconductor region may indicate that the respective average or mean dopant concentrations of the semiconductor regions differ from each other. For example, the average dopant concentration may be determined by averaging the dopant concentration in a volume defined by be diffusion length of free charge carrier in the respective semiconductor region or semiconductor zone. For example, such a volume may be a cube, wherein the edges of the cube are given by the diffusion length, or a sphere, wherein a diameter of the sphere is given by the diffusion length. Alternatively, the averaging may be carried out over a volume given (such as a cube or sphere) given by a vertical thickness of a drift region of the semiconductor device.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell or needle cell configuration, such as a power semiconductor transistor, that may be used within a power converter or a power supply. Thus, in an embodiment, the semiconductor device is configured to carry a load current that is to be fed to a load and/or, respectively, that is provided by a power source. For example, the semiconductor device may comprise one or more active power unit cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. Such diode cell and/or such transistor cells may be integrated in a power semiconductor module. A plurality of such cells may constitute a cell field that is arranged with a front side active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere or even up to some kA, and/or high voltages, typically above 100 V, more typically 500 V and above, e.g., up to at least 1 kV, up to at least more 3 kV. For example, the semiconductor device described below may be a semiconductor device exhibiting a stripe cell configuration or a needle cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor-based data processing.

Figure 1B:
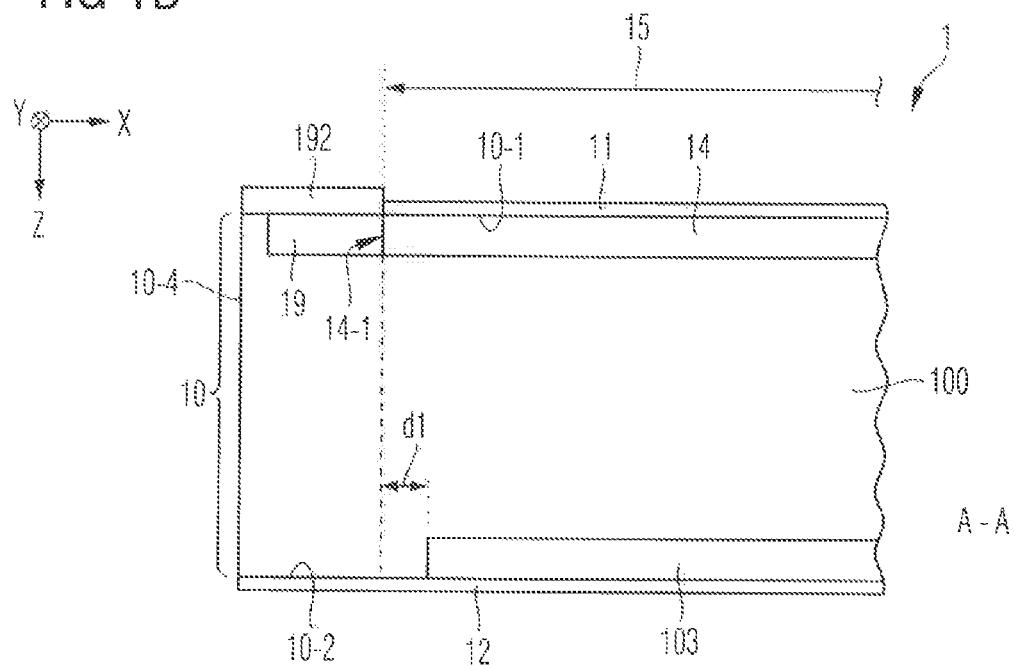
FIG. 1B schematically and exemplarily illustrates a section of a vertical cross-section (A-A) of the power semiconductor device of FIG. 1A.
Figure 1C:
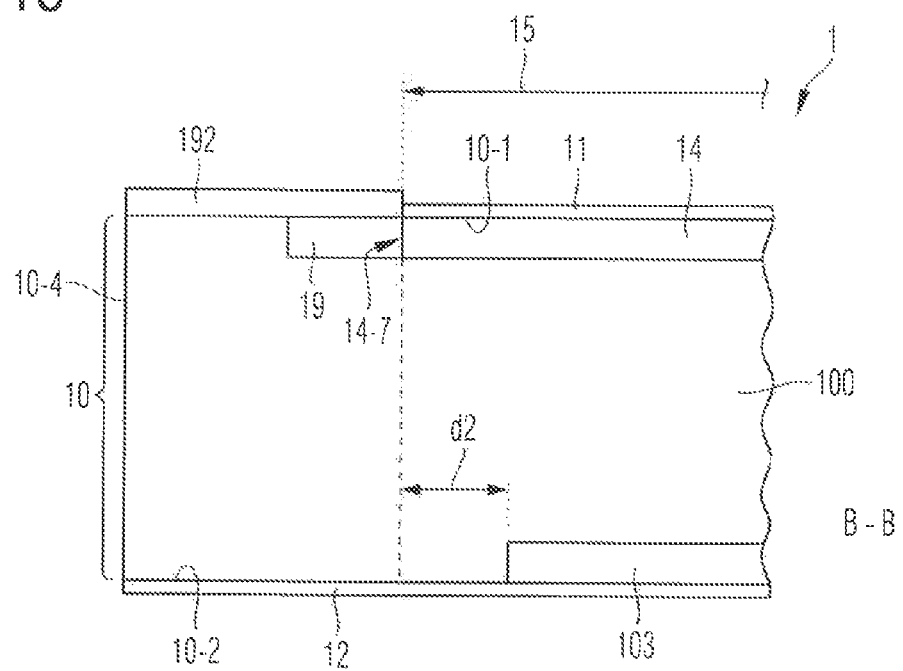
FIG. 1C schematically and exemplarily illustrates a section of another vertical cross-section (B-B) of the power semiconductor device of FIG. 1A.

FIG. 1A schematically and exemplarily illustrates a section of a vertical projection of a power semiconductor device 1 in accordance with one or more embodiments. The illustrated section is in parallel to a plane defined by a first lateral direction X and a second lateral direction Y and orthogonal to a vertical direction Z. FIG. 1B shows a section of a vertical cross-section A-A of the power semiconductor device 1 of FIG. 1A, and FIG. 1C shows a section of another vertical cross-section B-B of the power semiconductor device 1. In the following, reference is made to each of FIGS. 1A-C.

For example, the power semiconductor device 1 is or comprises a diode. In another embodiment, the power semiconductor device 1 may be or comprise a semiconductor switch, such as an IGBT.

The power semiconductor device 1 comprises a semiconductor body 10. For example, the semiconductor body 10 is a semiconductor chip, such as a silicon chip. As can be seen in the vertical cross-sections of FIGS. 1B-C, the semiconductor body 10 has a front side 10-1 coupled to a first load terminal structure 11 and a backside 10-2 coupled to a second load terminal structure 12. The first load terminal structure 11 may comprise a front side metallization, and the second load terminal structure 12 may comprise a backside metallization.

The semiconductor body 10 includes a drift region 100 of a first conductivity type, e.g, n-type. For example, the drift region 100 is an n⁻-region comprising n-type dopants at a relatively low dopant concentration. The drift region 100 is configured for carrying a load current that flows between the first load contact structure 11 and the second load contact structure 12 in a conducting state of the power semiconductor device 1. For example, the load current flows essentially along the vertical direction Z.

Further, the power semiconductor device 1 comprises a front side structure 14 that is arranged at the front side 10-1. The front side structure 14 may be at least partially included in the semiconductor body 10. The front side structure 14 may define a front side active region 15 that is configured for conducting the load current. For example, in case the power semiconductor device 1 is or comprises a diode, the front side structure 14 may be an anode region of a second conductivity type complementary to the first conductivity type, the anode region being included in the semiconductor body 10. In another embodiment, the front side structure 14 may be an active cell field comprising a plurality of IGBT cells (not depicted in FIGS. 1A-C).

As illustrated in FIG. 1A, the front side structure 14 exhibits a first lateral edge portion 14-1 and a second lateral edge portion 14-2. The first lateral edge portion 14-1 and/or the second lateral edge portion 14-2 may be essentially straight or linear edge portions. For example, the first lateral edge portion 14-1 and/or the second lateral edge portion 14-2 may have an essentially linear shape that extends in parallel to a second lateral direction Y or to a first lateral direction X, respectively (cf. FIG. 1A). For example, the first lateral edge portion 14-1 and the second lateral edge portion 14-2 may be essentially in parallel to corresponding lateral chip edges 10-4, 10-5 of the semiconductor body 10. The person skilled in the art will understand that the front side structure 14 may exhibit additional lateral edge portions, such as edge portions that are situated opposite to the first and second lateral edge portions 14-1, 14-2, respectively, cf. FIG. 1A.

For example, in an embodiment, the front side structure 14 comprises a semiconductor region of the second conductivity type (e.g., forming an anode region of a diode or a p-well region forming one or more body regions of an IGBT cell field), wherein an average dopant concentration of the second conductivity type may decrease when going from a central position within said semiconductor region of the second conductivity type towards a lateral chip edge 10-4, 10-5. In this case, a respective position of the first and/or second lateral edge portions 14-1, 14-2 (as well as of the first corner portion 14-7 described below) may be defined by a position where the average dopant concentration of the second conductivity type has dropped to 50% of a dopant concentration at said central position when going from the central position towards the first or second lateral chip edge 10-4, 10-5, respectively. It should be noted that said semiconductor region of the second conductivity type may also comprise, e.g., a $p^+$-type contact region or a portion of a VLD edge termination structure.

Alternatively, the first and second lateral edge portions 14-1, 14-2 (as well as the first corner portion 14-7 described below) may be defined as outer borders of an area where the first load contact structure 11 (e.g., a front side metallization) is in contact with the semiconductor body 10, cf. FIGS. 1B-1C. For example, the two definitions of the position of the lateral edge portions 14-1-, 14-2 and the first corner portions may coincide, as suggested in the exemplary embodiment of FIGS. 1B-1C. However, it should be noted that, in general, the two definitions need not necessarily coincide. For example, a front side metallization 11 may terminate at a position that is further away from a lateral chip edge 10-4, 10-5 than the position where the average dopant concentration of the second conductivity type of a semiconductor region of the front side structure 14 has dropped to 50% of a dopant concentration at a central position when going from the central position towards the first or second lateral chip edge 10-4, 10-5, respectively.

The front side structure 14 further exhibits a first corner portion 14-7 that forms a transition between the first lateral edge portion 14-1 and the second lateral edge portion 14-2. In the exemplary embodiment of FIG. 1A, the first corner portion 14-7 is a rounded corner. In another embodiment, the corner portion 14-7 may have a different shape, such as, e.g., a sharp corner. The person skilled in the art will understand that the front side structure 14 may exhibit additional corner portions, such as, e.g., four corner portions, as exemplarily illustrated in FIG. 1A.

For example, in case the first lateral edge portion 14-1 and/or the second lateral edge portion 14-2 are essentially linear edge portions and the first corner portion 14-7 is a rounded corner, an onset 14-71, 14-72 of the first corner portion 14-7 may be marked by a deviation from the linear shape of the respective edge of the front side structure 14, i.e., by an onset of a finite curvature of the respective edge of the front side structure 14, as exemplarily illustrated in FIG. 1A.

Further, in between a chip edge, which may have come into being, e.g., by means of wafer dicing, and the front side structure 14, there may be arranged an edge termination structure 19. Such an edge termination structure 19 may be arranged in and/or on top of the semiconductor body 10. For example, the edge termination structure 19 may entirely surround the front side structure 14 in a vertical projection. The edge termination structure 19 may not be configured for conducting a load current, but may rather be configured to ensure a reliable blocking capability of the power semiconductor device 1, in accordance with an embodiment. For example, the edge termination structure 19 comprises a variation-of-lateral-doping (VLD) structure. In other embodiments, at least one of a junction-termination-extension (JTE) structure and a field ring/field plate termination structure may be provided instead of or in addition to a VLD structure. The skilled person is acquainted with these kinds of edge termination structures. For example, a passivation layer 192 may be arranged at the front-side 10-1 above the edge termination structure 19, as depicted in FIGS. 1A-C.

The power semiconductor device further comprises a backside emitter region 103 being arranged in the semiconductor body 10 in contact with the second load terminal structure 12. The backside emitter region 103 has a net dopant concentration that is higher than a net dopant concentration of the drift region 100. For example, the net dopant concentration may be of the first conductivity type (such as, e.g., n-type). In other words, there may be, for example, only n-type dopants or a higher dopant concentration of n-type dopants than of p-type dopants inside the backside emitter region 103. In another embodiment, the net dopant concentration may be of a second conductivity type complementary to the first conductivity type (such as, e.g., p-type). In other words, there may be, for example, only p-type dopants or a higher dopant concentration of p-type dopants than of n-type dopants inside the backside emitter region 103. For example, the backside emitter region 103 may be configured for injecting charge carriers of the respective first or second conductivity type into the drift region 100 in the conducting state of the power semiconductor device 1. For example, a bipolar conduction mode of the power semiconductor device 1 may thus be enabled.

In case the power semiconductor device 1 is or comprises a power diode, the backside emitter region 103 may be, for example, of the first conductivity type, i.e., an (n$^+$-type) cathode region. In another embodiment, wherein the power semiconductor device 1 is or comprises an IGBT, the backside emitter region 103 may be of the second conductivity type, forming, e.g., a (p$^+$-type or p-type) backside emitter region 103 of the IGBT.

In a vertical projection, as illustrated in FIG. 1A, the backside emitter region 103 laterally terminates at a first distance d1 from the first lateral edge portion 14-1. For example, a common lateral extension range (in the present example along the first lateral direction X) of the front side structure 14 and the backside emitter region 103 may terminate at the first distance d1 from the first lateral edge portion.

For example, an average dopant concentration of the backside emitter region 103 of may decrease when going from a central position within the backside emitter region 103 towards a lateral chip edge 10-4, 10-5. In this case, a position where the backside emitter region 103 laterally terminates may be defined as a position where the average dopant concentration of the backside emitter region 103 has dropped to 50% of a dopant concentration at said central position when going from the central position towards a lateral chip edge 10-4, 10-5. This decrease of the dopant concentration by 50% may occur within the backside emitter region 103 at an arbitrary position along the vertical direction Z. For example, in case the backside emitter region 103 comprises an n-doped cathode emitter of a diode and a field stop region on top of the cathode emitter, a lateral border of the backside emitter region 103 may be defined by a decrease of the dopant concentration inside the field stop region by 50%. For example, the backside emitter region 103 with its lateral borders as defined above may thus define a backside active area of the semiconductor device 1.

In the exemplary embodiment depicted in FIG. 1A, the backside emitter region 103 laterally terminates at the same first distance d1 from the second lateral edge portion 14-2. However, in general, a distance of the backside emitter region 103 from the first lateral edge portion 14-1 may be different from a distance of the backside emitter region 103 from the second lateral edge portion 14-2. Thus, the first distance d1 may be a distance from only one of the first and second lateral edges 14-1, 14-2.

Further, in the vertical projection, the backside emitter region 103 laterally terminates at a second distance d2 from the first corner portion 14-7, wherein the second distance d2 is larger than the first distance d1. For example, the difference in distance between the second distance d2 and the first distance d1 is larger than zero, and may amount to at least one times the diffusion length of free charge carriers or may amount to at least half of the vertical extension of the drift region 100. For example, if the first distance d1 and the second distance d2 are both positive, the second distance d2 may amount to at least 1.5 times, such as at least twice, or even at least five times the first distance d1.

For example, in an embodiment wherein the front side structure 14 exhibits several lateral edge portions and associated corner portions (such as four corner portions as illustrated in FIG. 1A), the same or a similar relations may apply to corresponding distances between the further corner portions and the backside emitter region 103 and corresponding distances between associated lateral edge portions and the backside emitter region 103.

It should be noted that, in the vertical projection, a shortest distance from the backside emitter region 103 to the first lateral edge portion 14-1 and/or to the second lateral edge portion 14-2 may vary along the respective first or second lateral edge portion 14-1, 14-2, i.e., depending on which precise point at the respective lateral edge portion 14-1, 14-2 is considered. Likewise, a shortest distance from the backside emitter region 103 to the first corner portion 14-7 may vary along the first corner portion 14-7, as illustrated in FIG. 1A. In other words, said first and second distances d1, d2 may be comprised in a plurality (e.g., in a continuum) of varying shortest distances from the backside emitter region 103 to the respective lateral edge portion 14-1, 14-2 or first corner portion 14-7.

For example, said shortest distance as well as the first distance d1 and the second distance d2 may be coarse-grained distances in the sense that they are averages of shortest distances from the backside emitter region 103 to the respective lateral edge portion 14-1, 14-2 or first corner portion 14-7 taken over a coarse graining length along the respective lateral edge portion 14-1, 14-2 or first corner portion 14-7. For example, the coarse graining length may be given by a fraction of length of a lateral chip edge 10-4, 10-5, e.g. 30% of the length of the shortest chip edge. Alternatively, the coarse graining length may correspond to a diffusion length of free charge carriers in the drift region 100. For example, accidental variations of the distances on a very short length scale may be smoothened out by considering such coarse-grained distances.

In an embodiment, wherein the front side structure 14 exhibits a further lateral edge portion opposite to the first lateral edge portion 14-1 (or to the second lateral edge portion 14-2), the first distance d1 may be defined as an arithmetic average of the distance between the backside emitter region 103 and the first (second) lateral edge portion 14-1 (14-2) (e.g., coarse-grained over a coarse graining length around a particular point of the first (second) lateral edge portion (14-2)) and a distance between the backside emitter region 103 and said further lateral edge portion opposite to the first (second) lateral edge portion 14-1 (14-2) (e.g., coarse-grained over the coarse graining length around a particular point of said further lateral edge portion that may be located opposite to said point of the first (second) lateral edge portion 14-1 (14-2)). Likewise, the second distance d2 may be defined as an arithmetic average of a distance between the backside emitter region 103 and the first corner portion 14-7 (e.g., coarse-grained over a coarse graining length around a particular point of the first corner portion 14-7) and a distance between the backside emitter region 103 and said further lateral edge portion opposite to the first lateral edge portion 14-1 (e.g., coarse-grained over the coarse graining length around a particular point of said further lateral edge portion that may be located opposite to said point of the first lateral edge portion 14-7). For example, misalignment errors may be compensated by considering the arithmetic averages.

It should further be noted that said shortest distance as well as each of the first distance d1 and the second distance d2 may be either positive or zero or negative. The shortest distance and the first and second distances d1, d2 are defined to be positive where, in the vertical projection, the front side structure 14 has less distance to the closest lateral chip edge 10-4, 10-5 than the backside emitter region 103, as illustrated in FIG. 1A, whereas they are defined to be negative in the opposite case, as exemplarily illustrated at the first and second lateral edge portions 14-1, 14-2 in FIG. 3A.

In the present specification, the requirement that the second distance d2 is larger, i.e. more positive, than the first distance d1 is to be understood by taking into account the sign (i.e., plus or minus) of the respective distance d1, d2 as defined above. For example, the second distance d2 is larger than the first distance d1 if the first distance d1 and the second distance d2 are both positive and the second distance d2 has a larger amount than the first distance d1 (cf. FIG. 1A). As another example, the second distance d2 is larger than the first distance d1 if the second distance d2 is positive and the first distance d1 is negative, as exemplarily illustrated in FIG. 3A. As a further example, the second distance d2 is also larger than the first distance d1 if the first distance d1 and the second distance d2 are both negative and the first distance d1 has a larger amount than the second distance d2 (not illustrated).

For example, said (potentially coarse-grained) shortest distance, first distance d1, and/or second distance d2 may have values in a range from 5 to 2000 μm, such as 10 μm to 700 μm, e.g., 15 μm to 400 μm or 20 μm to 100 μm. One or more of said distances may zero be zero or negative, such as in the range from 0 μm to −80 μm or from −10 to −50 μm. For example, as exemplarily depicted in FIG. 3A, the shortest distance along the first and second lateral edge portions 14-1, 14-2 may vary in a range comprising zero and negative values, such as in the range from 0 μm to −80 μm or from −10 μm to −50 μm.

For example, in the vertical projection, when starting from the cut line A-A shown in FIG. 1A and moving along the first lateral edge portion 14-1 and the first corner portion 14-7 towards the cut line B-B, the coarse-grained distance between the backside emitter region 103 and the respective first lateral edge portion 14-1 or first corner portion 14-7 increases (e.g. from the first distance d1 to the second distance d2). When further moving from the cut line B-B along the first corner portion 14-7 and the second lateral edge portion 14-2 towards the line C-C, the coarse-grained distance decreases again (e.g., from the second distance d2 to the first distance d1).

In an embodiment, the first distance d1 amounts to at least 0.5 times, such as at least 1 times, e.g., at least twice a diffusion length of free charge carriers. For example, the diffusion length may be a diffusion length of minority charge carriers with regard to the conductivity type of the drift region 100, i.e., of free charge carriers of the second conductivity type inside the drift region 100. For example, the diffusion length is in a range from 2 μm to 1000 μm, such as in a range from 10 μm to 500 μm.

For example, each of the first distance d1 and the second distance d2 may be in a range from 5 μm to 2000 μm, such as in a range of 10 μm to 800 μm or such as in a range from 20 μm to 500 μm or such as in a range from 40 to 160 μm.

Figure 2A:
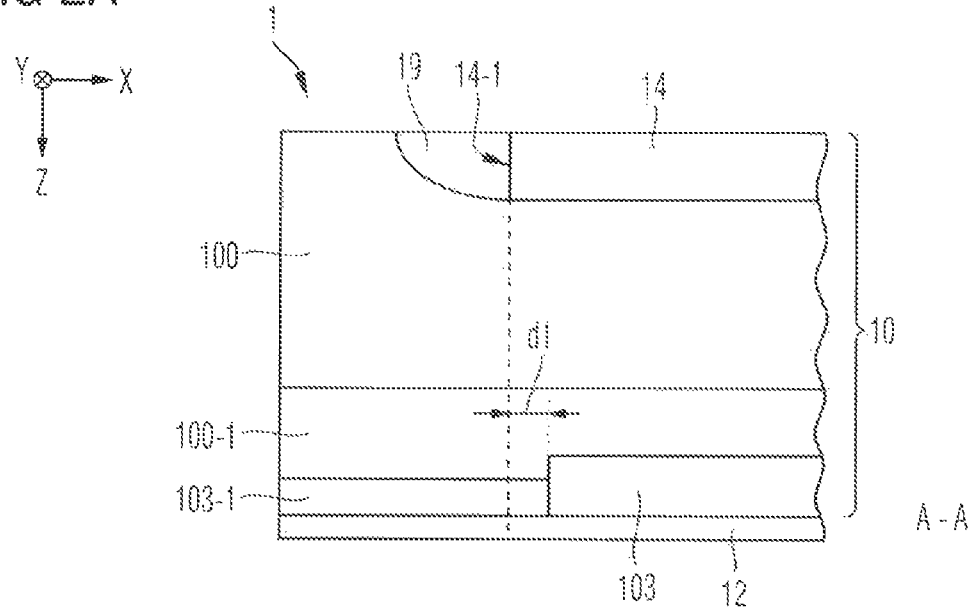
FIG. 2A schematically and exemplarily illustrates a section of a vertical cross-section of a power semiconductor device in accordance with one or more embodiments.
Figure 2B:
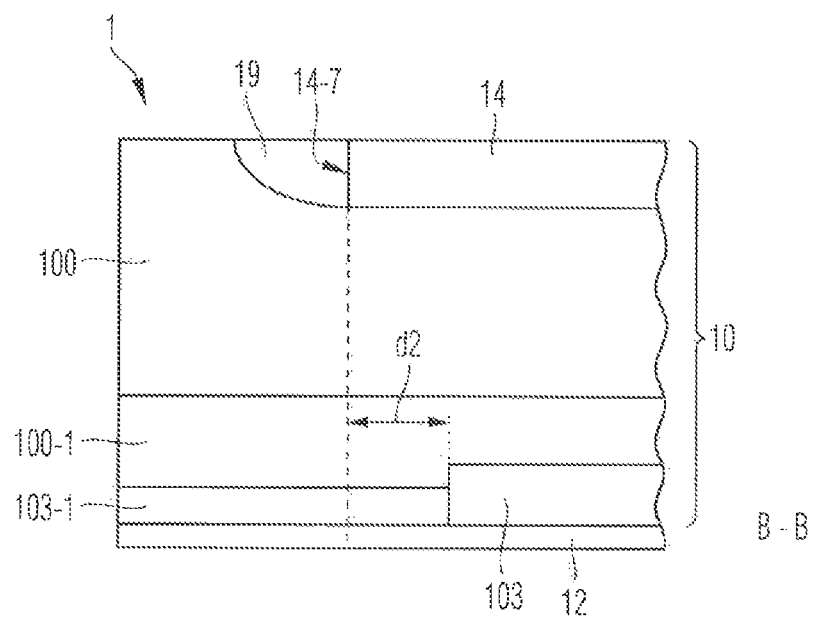
FIG. 2B schematically and exemplarily illustrates a section of another vertical cross-section of the power semiconductor device of FIG. 2A.

FIG. 2A shows a section of a vertical cross-section A-A of the power semiconductor device 1 of FIG. 1A according to a further embodiment. FIG. 2B shows a section of another vertical cross-section B-B of the power semiconductor device 1. For example, in an embodiment in accordance with FIGS. 2A-B, the front side structure 14 is an active cell field of a plurality of IGBT cells (not illustrated).

In the embodiment of FIGS. 2A-B, a VLD edge termination structure 19 is arranged in the semiconductor body 10 adjacent to the active cell field 14.

Further, as illustrated in FIGS. 2A-B, a field stop region 100-1 may be included in the drift region 100, the field stop region 100-1 having dopants of the first conductivity type at a higher dopant concentration than the drift region 100 external of the field stop region 100-1. For example, the field stop region 100-1 is an n- or $n^+$-type region.

In a variant embodiment, in a vertical projection, a dopant concentration of dopants of the first conductivity type inside the field stop region 100-1 may be higher in the vicinity of the corner portion 14-7 and/or in the vicinity of a chip corner than in the vicinity of each of the first lateral edge portion 14-1 and the second lateral edge portion 14-2. For example, a partial transistor gain $\alpha_{pnp}$ may thus be locally reduced in the vicinity of one or more corner portions 14-7 of, e.g., an active cell field 14 and/or in the vicinity of a chip corner.

For example, in the vicinity of the first corner portion 14-7, the field stop region 100-1 may comprise selenium and/or sulfur dopants. An increased dopant concentration of the field stop region 101-1 in the vicinity of the first corner portion 14-7 as described above may, for example, be achieved, by an implantation of selenium and/or sulfur dopants, possibly followed by a laser annealing process. For example, the selenium dopants may be configured for providing deep energy levels that are activated with increasing temperature, thereby reducing an injection of free charge carriers at high temperatures in the vicinity of one or more corner portions 14-7 of the active cell field 14 and/or in the vicinity of a chip corner. Alternatively, the field stop layer which may be realized by a proton implantation, may comprise the highest proton-induced doping level in the vicinity of the first corner portion 14-7 by using e.g. a higher proton implantation dose in that area.

In another variant embodiment, in a vertical projection, a dopant concentration of dopants of the first conductivity type inside the field stop region 100-1 may be lower in the vicinity of the corner portion 14-7 and/or in the vicinity of a chip corner than in the vicinity of each of the first lateral edge portion 14-1 and the second lateral edge portion 14-2. For example, in case the power semiconductor device 1 is or comprises a diode (i.e., the front side structure 14 may, e.g., comprise an anode region of a diode and the backside emitter region 103 may form a cathode emitter) a backside emitter efficiency may thus be locally reduced in the vicinity of one or more corner portions 14-7 of, e.g., an active cell field 14 and/or in the vicinity of a chip corner.

It should be noted that such a dopant concentration profile exhibiting a higher (or lower) field stop dopant concentration in the vicinity of one or more corner portions 14-7 than in the vicinity of one or more edge portions 14-1, 14-2 may be implemented completely independently of the dimension of the backside emitter region described above, i.e., of the feature regarding said first and second distances d1, d2 from the lateral edge portions and the corner portion, respectively. In other words, said increase (or, respectively, decrease) of the field stop dopant concentration in the vicinity of the corner portion 14-7 as compared to the field stop dopant concentration in the vicinity of the first and second lateral edge portions 14-1, 14-2, represents an independent aspect of the present invention. Further, it may be combined with all other aspects described herein.

The backside emitter region 103 may be a region of the second conductivity type, such as a p$^+$-type region. Regarding the first and second distances d1, d2, it is referred to the above explanations in connection with FIGS. 1A-C. With respect to FIGS. 2A-B it should be noted that there may be provided second backside region 103-1 of the second conductivity type, the second backside region 103-1 being arranged in contact with the second load terminal 12. The second backside region 103-1 may have a net dopant concentration of the second conductivity type that is lower than the net dopant concentration of the second conductivity type of the backside emitter region 103. For example, the second backside region 103-1 may be one of a p$^-$-doped and a p-doped region if the backside emitter region 103 is a p$^+$-doped region. For example, the second backside region 103-1 may be configured for ensuring a reverse blocking capability of the power semiconductor device 1. It should, however, be noted that said first and second distances d1, d2 are defined as explained above based on the backside emitter region 103, as opposed to such a second backside region 103-1 that may be present in addition to the backside emitter region 103.

According to a variant embodiment, inside an edge region of the power semiconductor device 1, the backside emitter region 103-1 may comprise dopants of the opposite doping type of the backside emitter of the diode or IGBT to reduce the emitter efficiency in the edge and/or corner region, in particular in the vicinity of a corner region, such as below a first corner portion 14-7 of a front side structure 14. For example, the dopants of the opposite doping type may be provided via a masked counterdoping process which realizes areas having a relatively low net dopant concentration.

In a further variant embodiment, inside a corner region of the power semiconductor device 1, such as below a first corner portion 14-7 of the front side structure 14, a field stop region 101 that is provided in the semiconductor body 10 may comprise dopants which provide at least one deep energy level. For example, the at least one deep energy level is situated at distance of at least 160 meV, such as at least 200 meV from the conduction band edge. The at least one deep energy level may be configured for reducing an injection of free charge carriers in the edge region. Further, said dopants may be activated in a reverse blocking state, thereby contributing to a reverse blocking capability of the power semiconductor device 1.

Figure 3B:
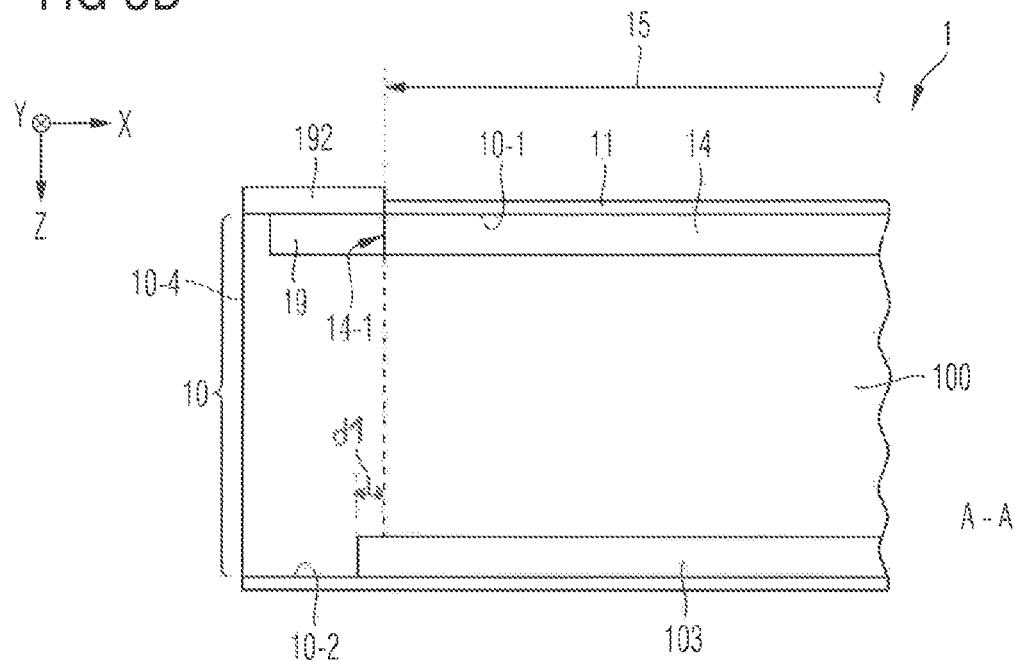
FIG. 3B schematically and exemplarily illustrates a section of a vertical cross-section (A-A) of the power semiconductor device of FIG. 3A.
Figure 3C:
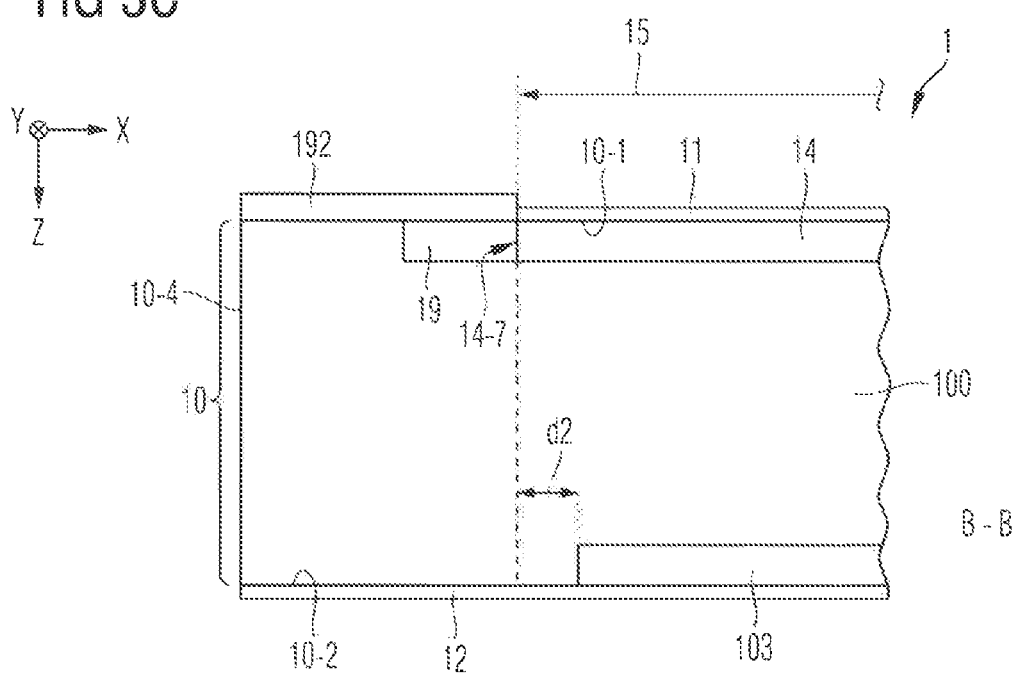
FIG. 3C schematically and exemplarily illustrates a section of another vertical cross-section (B-B) of the power semiconductor device of FIG. 3A.

FIG. 3A schematically and exemplarily illustrates a section of a vertical projection of a power semiconductor device 1 in accordance with one or more embodiments. The illustrated section is in parallel to a plane defined by a first lateral direction X and a second lateral direction Y and orthogonal to a vertical direction Z. FIG. 3B shows a section of a vertical cross-section A-A of the power semiconductor device 1 of FIG. 3A, and FIG. 3C shows a section of another vertical cross-section B-B of the power semiconductor device 1. The exemplary embodiment shown in FIGS. 3A-C differs from the one explained above with reference to FIGS. 1A-C in that, in the vertical projection, lateral edges of the backside emitter region 103 extend beyond the lateral edges 14-1, 14-2 of the front side structure 14. In other words, in the lateral projection, a first distance d1 between the backside emitter region 103 on the one hand and the first and/or second lateral edge portions 14-1, 14-2 on the other hand, is negative.

For example, in another embodiment, one or more lateral edges of the backside emitter region 103 may extend essentially below and in parallel to the first and/or second later edge portion 14-1, 14-2 of the front side structure 14. In this case the first distance d1 would be zero or essentially zero. Apart from this, what has been stated above with regard to the exemplary embodiment of FIGS. 1A-C also applies to the exemplary embodiment illustrated in FIGS. 3A-C. For example, the backside emitter region 103 terminates at a positive second distance d2 from the first corner portion 14-7 of the front side structure 14. In other words, the backside emitter region 103 may be laterally recessed with respect to one or more corner portions 14-7, such as rounded corner portions 14-7, of the front side structure 14.

Figure 4A:
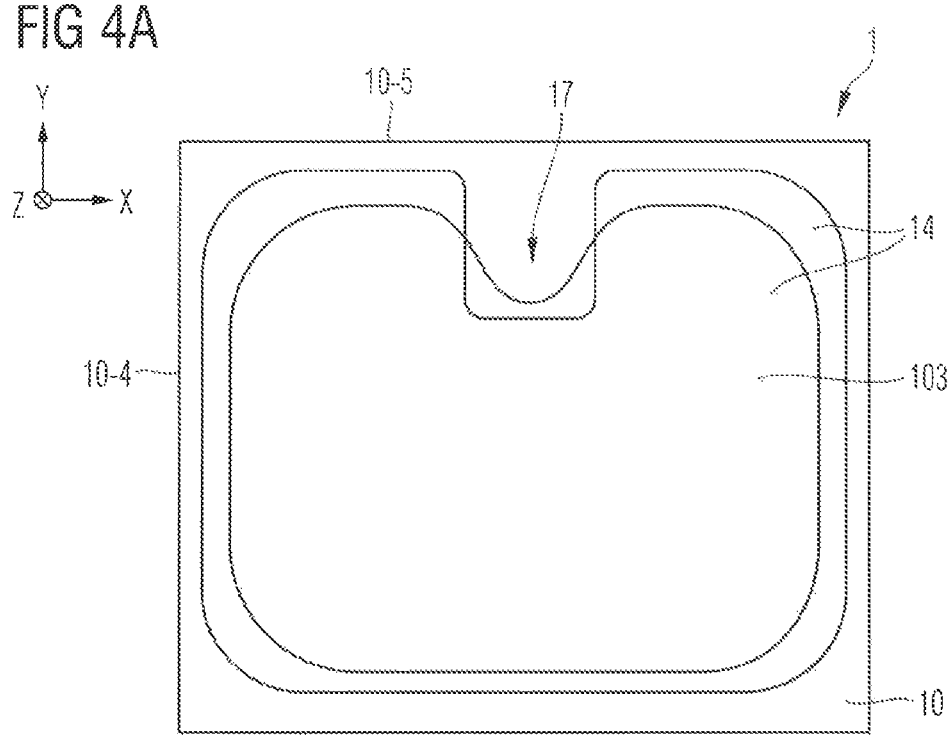
FIG. 4A schematically and exemplarily illustrates a section of a vertical projection of a power semiconductor device in accordance with one or more embodiments.

FIG. 4A schematically and exemplarily illustrates a section of a vertical projection of a power semiconductor device in accordance with one or more embodiments. Similar to what has been explained above, in the exemplary embodiment of FIG. 4A, the front side structure 14 may be a cell field comprising a plurality of IGBT cells (not depicted). For example, the front side structure 14 is an active cell field comprising a plurality of active IGBT cells, wherein each active IGBT cell comprises a source region that is electrically connected to the first load terminal 11. The IGBT cells may exhibit a periodicity, e.g., along the first lateral direction X and/or along the second lateral direction Y. For example, the IGBT cells may be arranged in one of a stripe cell configuration and a needle cell configuration. The person skilled in the art will easily identify lateral borders of such an active cell field 14. For example, outside the active cell field 14 there may be no active IGBT cells (i.e., no cells having a source region connected to the first load contact) or at most singular active IGBT cells, which are not arranged corresponding to a periodicity of the active IGBT cells within the active cell field 14. As shown in FIG. 4A, the front side structure 14 exhibits a recess towards a center of the front side structure 14 (considered in the vertical projection). The recess may define a pad region 17 that is provided for arranging a contact pad, such as a gate pad, at the front side 10-1.

Figure 4B:
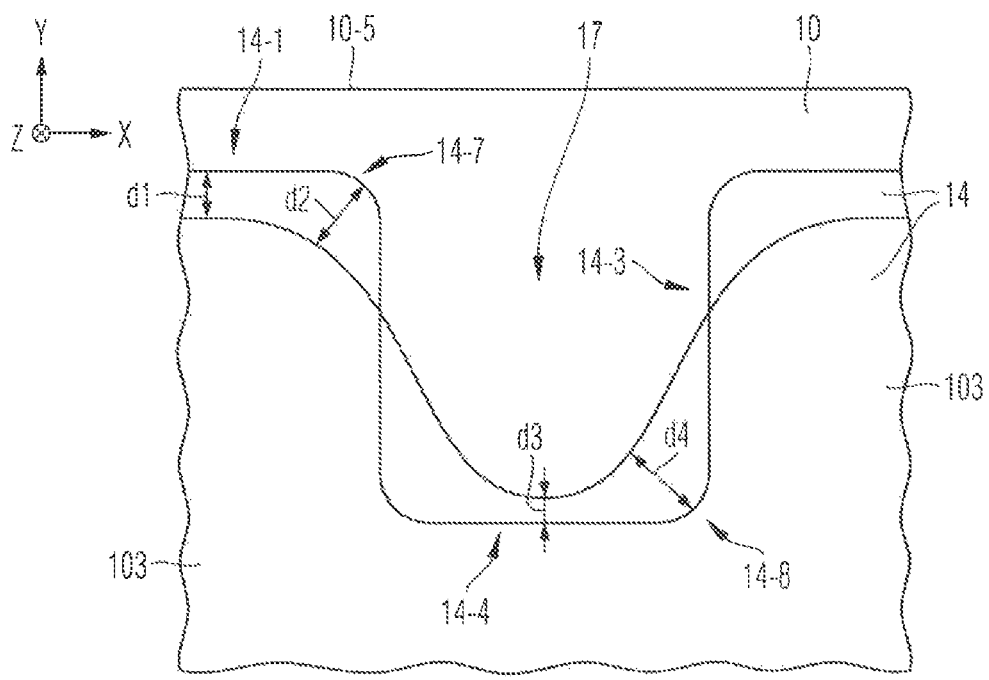
FIG. 4B is an enlarged view of a portion comprising a pad region of the power semiconductor device of FIG. 4A.

FIG. 4B is an enlarged view of a portion comprising the pad region 17 of the power semiconductor device 1 of FIG. 4A. The front side structure 14 has a third lateral edge portion 14-3 extending alongside the pad region 17, a fourth lateral edge portion 14-4 extending alongside the pad region 17, and a second corner portion 14-8 that forms a transition between the third lateral edge portion 14-3 and the fourth lateral edge portion 14-4. For example, the third lateral edge portion 14-3 and the fourth lateral edge portion 14-4 may be essentially in parallel to corresponding lateral edges of a gate pad (not illustrated) arranged inside the pad region 17 at the front side 10-1 of the semiconductor body 10.

As in the embodiments described above, the power semiconductor device 1 further comprises a drift region (not illustrated) of a first conductivity type being included in the semiconductor body 10 and being configured for carrying the load current. Further, the power semiconductor device 1 comprises a backside emitter region 103 being arranged in the semiconductor body 10 in contact with the second load terminal 12. The backside emitter region 103 may has a net dopant concentration that is higher than a net dopant concentration of the drift region. For example, the backside emitter region 103 is of the second conductivity type, such as p- or $p^+$-type.

In a vertical projection, an overlap of the pad region 17 and the backside emitter region 103 laterally terminates at a third distance d3 from the third lateral edge portion 14-3 and/or the fourth lateral edge portion 14-4 and at a fourth distance d4 from the second corner portion 14-8, wherein the fourth distance d4 is larger than the third distance d3. In other words, in a vertical projection, the backside emitter region 103 may extend further into the pad region 17 in the vicinity of the second corner portion 14-8 than in the vicinity of the third lateral edge portion 14-3 and/or the fourth lateral edge portion 14-4. For example, the fourth distance d4 may amount to at least 1.5 times, such as at least twice, or even at least five times the third distance d3.

In an embodiment, the third distance d3 amounts to at least 0.5 times, such as at least 1 times, e.g., at least twice a diffusion length of free charge carriers. For example, the diffusion length may be a diffusion length of minority charge carriers with regard to the conductivity type of the drift region 100, i.e., of free charge carriers of the second conductivity type inside the drift region 100. For example, the diffusion length is in a range from 2 µm to 1000 µm, such as in a range from 10 µm to 500 µm.

For example, each of the third distance d3 and the fourth distance d4 may be in a range from 5 µm to 500 µm, such as 10 µm to 300 µm, e.g., in a range from 40 µm to 160 µm.

Additionally, as illustrated in FIG. 4B, the front side structure 14 may exhibit a first corner portion 14-7 and a first lateral edge 14-1 portion, wherein the same relation between a first distance d1 and a second distance d2 as described above may apply.

Figure 5B:
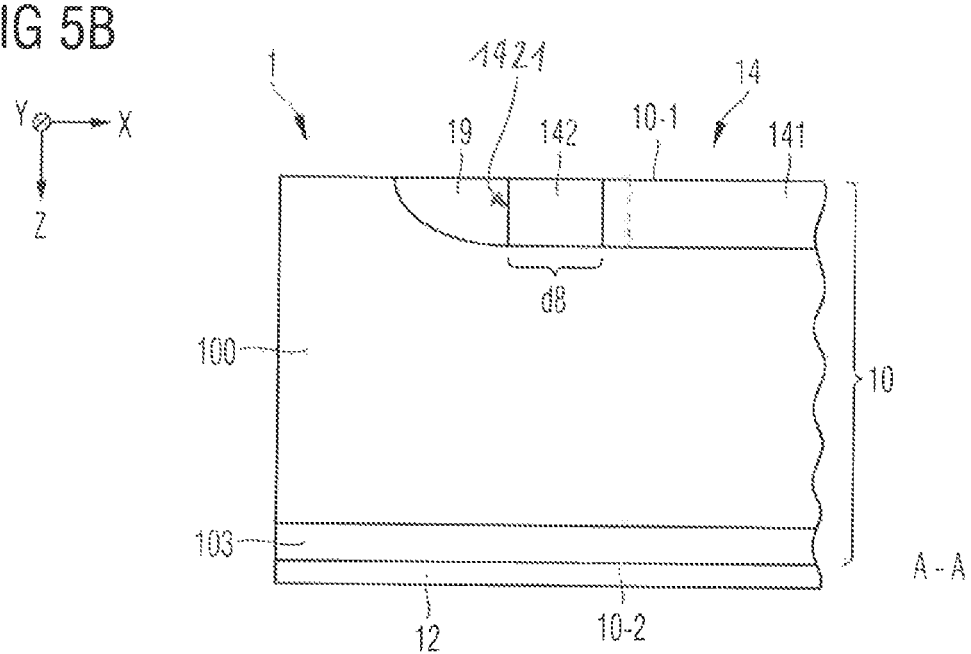
FIG. 5B schematically and exemplarily illustrates a section of a vertical cross-section (A-A) of the power semiconductor device of FIG. 5A.
Figure 5C:
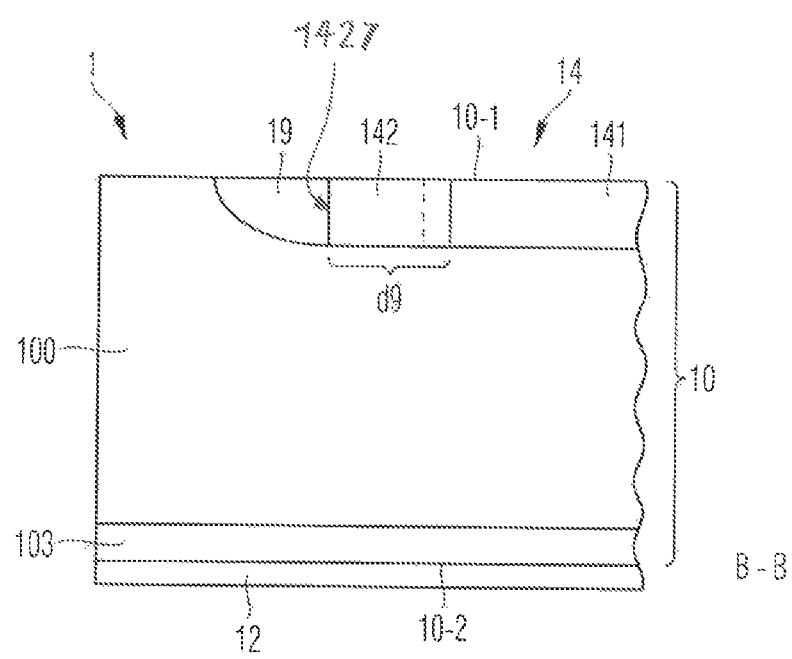
FIG. 5C schematically and exemplarily illustrates a section of another vertical cross-section (B-B) of the power semiconductor device of FIG. 5A.

FIG. 5A schematically and exemplarily illustrates a section of a vertical projection of a power semiconductor device 1 in accordance with one or more embodiments. The illustrated section is in parallel to a plane defined by a first lateral direction X and a second lateral direction Y and orthogonal to a vertical direction Z. FIG. 5B shows a section of a vertical cross-section A-A of the power semiconductor device 1 of FIG. 5A, and FIG. 5C shows a section of another vertical cross-section B-B of the power semiconductor device 1. FIG. 5D is a more detailed view of a section of the vertical cross-section of FIG. 5B, and FIG. 5E is a more detailed view of a section of the vertical cross-section of FIG. 5C. In the following, reference is made to each of FIGS. 5A-C.

According to the embodiment of FIGS. 5A-E, a power semiconductor device 1 comprises a semiconductor body 10 having a front side 10-1 coupled to a first load terminal structure 11 and a backside 10-2 coupled to a second load terminal structure 12. Further, a front side structure 14 is arranged at the front side 10-1 and is at least partially included in the semiconductor body 10. The front side structure 14 includes an active cell field 141 comprising a plurality of IGBT cells 1410. Each IGBT cell 1410 comprises a source region 104 of a first conductivity type being arranged in contact with the first load terminal structure 11 and a body region 105 of a second conductivity type complementary to the first conductivity type. The active cell field 141 may define a front side active region 15 that is configured for conducting a load current between the first load terminal structure 11 and the second load terminal structure 12 in a conducting state of the power semiconductor device 1.

The front side structure 14 further includes a drainage structure 142 comprising a plurality of drainage cells 1420. Each drainage cell 1420 comprises a drainage region 106 of the second conductivity type that is arranged in contact with the first load terminal structure 11. In contrast to the IGBT cells 1410, each drainage cell 1420 does not comprise a source region of the first conductivity type being arranged in contact with the first load terminal structure 11.

The drainage structure 142 is arranged laterally in between the active cell field 141 and an edge termination region 19 of the semiconductor device 1. Further, the drainage structure 142 exhibits a first outer edge portion 1421, a second outer edge portion 1422, and an outer corner portion 1427 that forms a transition between the first outer edge portion 1421 and the second outer edge portion 1422. A minimal distance d9 between the active cell field 141 and the outer corner portion 1427 is larger than a minimal distance d8 between the active cell field 141 and each of the first outer edge portion 1421 and the second outer edge portion 1422. For example, the minimal distance d9 is larger than the minimal distance d8 at least by a factor of 1.5, such as at least by a factor of 2 or even at least a factor of 5.

The aspects regarding the active cell field 141 and the drainage structure 142 as described above with reference to FIGS. 5A-E may be combined with the other aspects of the invention described above and/or below. However, it should be noted that said aspects regarding the active cell field 141 and the drainage structure 142 represent an independent aspect of the present invention.

Figure 6B:
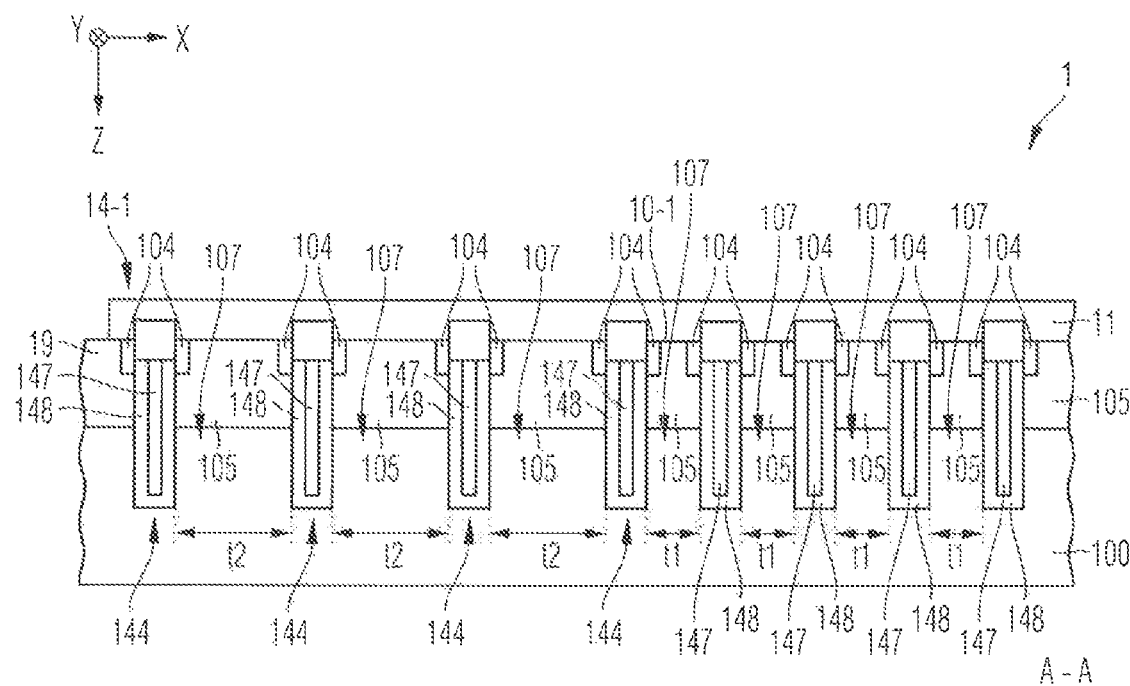
FIG. 6B schematically and exemplarily illustrates a section of a vertical cross-section (A-A) of the power semiconductor device of FIG. 6A.
Figure 6C:
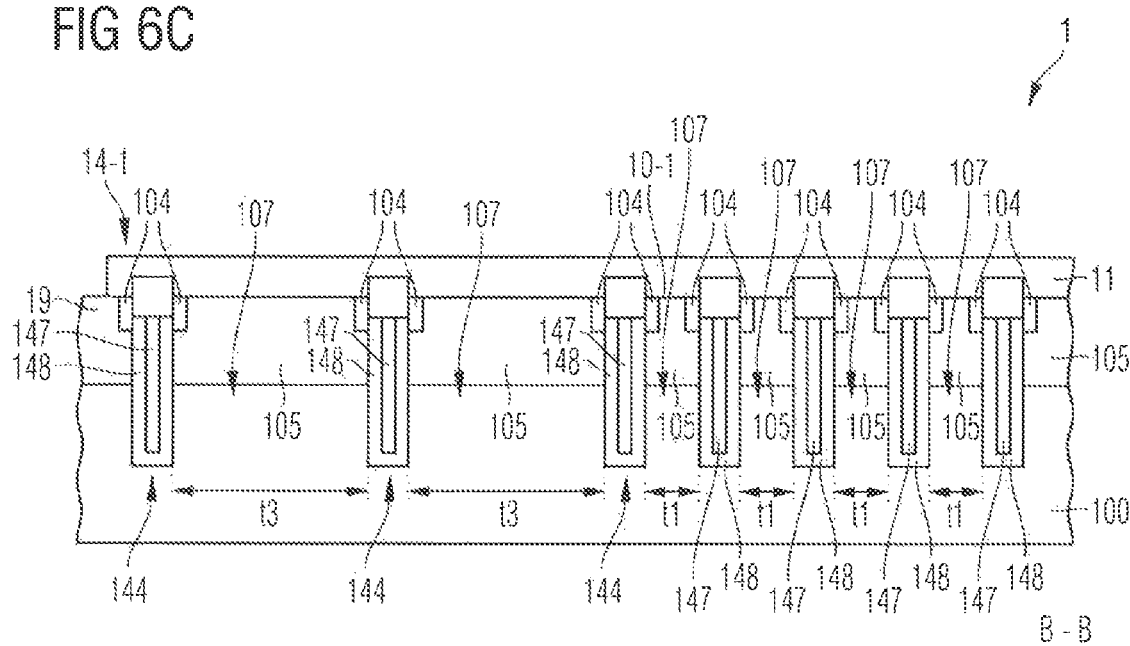
FIG. 6C schematically and exemplarily illustrates a section of another vertical cross-section (B-B) of the power semiconductor device of FIG. 6A.

FIG. 6A schematically and exemplarily illustrates a section of a vertical projection of a power semiconductor device in accordance with one or more embodiments. FIG. 6B illustrates a section of a vertical cross-section A-A of the power semiconductor device of FIG. 6A, and FIG. 6C illustrates a section of another vertical cross-section B-B of the power semiconductor device of FIG. 6A. In the following, it is referred to each of FIGS. 6A-C.

The power semiconductor device 1 of FIGS. 6A-C comprises several elements that have been described previously with regard to other embodiments and which are marked in FIGS. 6A-C with the same reference numerals as before. For example, the power semiconductor device 1 comprises a front side structure 14 in the form of an active cell field 14 of a plurality of IGBT cells. As can be seen in FIGS. 6B-C, the cell field 14 comprises a plurality of trenches 144, such as gate trenches, which are in each case separated from a respective neighboring trench 144 of the cell field 14 by a semiconductor mesa region 107. For example, the mesa regions 107 may be configured for conducting at least a part of the load current in the conducting state of the semiconductor device 1.

A lateral extension t2, t3 of the semiconductor mesa regions 107 in the vicinity of an outer edge of the cell field 14 (such as in the vicinity of a first corner portion 14-7 and/or of a first or second lateral edge portion 14-1, 14-2, as described above) may be larger than a lateral extension t1 of semiconductor mesa regions 107 in a central portion of the cell field 14. For example, a lateral extension of the semiconductor mesa regions 107 may continuously increase from the central portion of the cell field 14 towards the outer edge of the cell field 14.

Additionally or alternatively, in an embodiment, a lateral extension t3 of the semiconductor mesa regions 107 in the vicinity of the first corner portion 14-7 may be larger than a lateral extension t2 of semiconductor mesa regions in the vicinity of the first and/or second lateral edge portion 14-1, 14-2. For example, a lateral extension of the semiconductor mesa regions 107 may continuously increase from the first or second lateral edge portion 14-1, 14-2 towards the first corner portion.

The aspects regarding the lateral extension of semiconductor regions 107 as described above with reference to FIGS. 6A-C may be combined with other aspects of the invention described above and/or below. However, it should be noted that said aspects regarding the lateral extension of semiconductor regions 107 represent an independent aspect of the present invention.

Figure 7A:
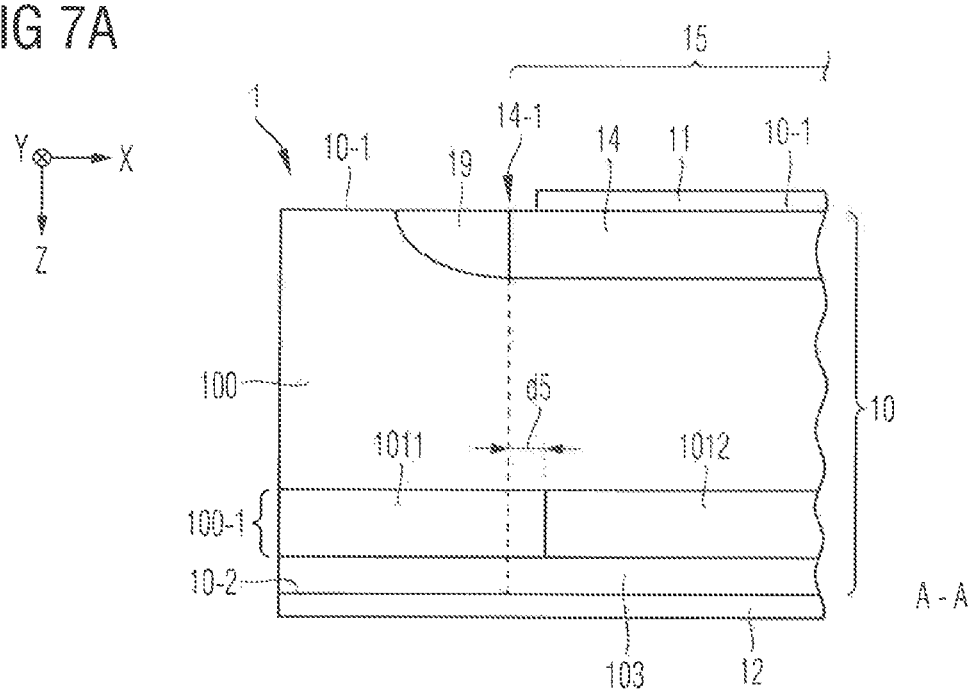
FIG. 7A schematically and exemplarily illustrates a section of a vertical cross-section of a power semiconductor device in accordance with one or more embodiments.
Figure 7B:
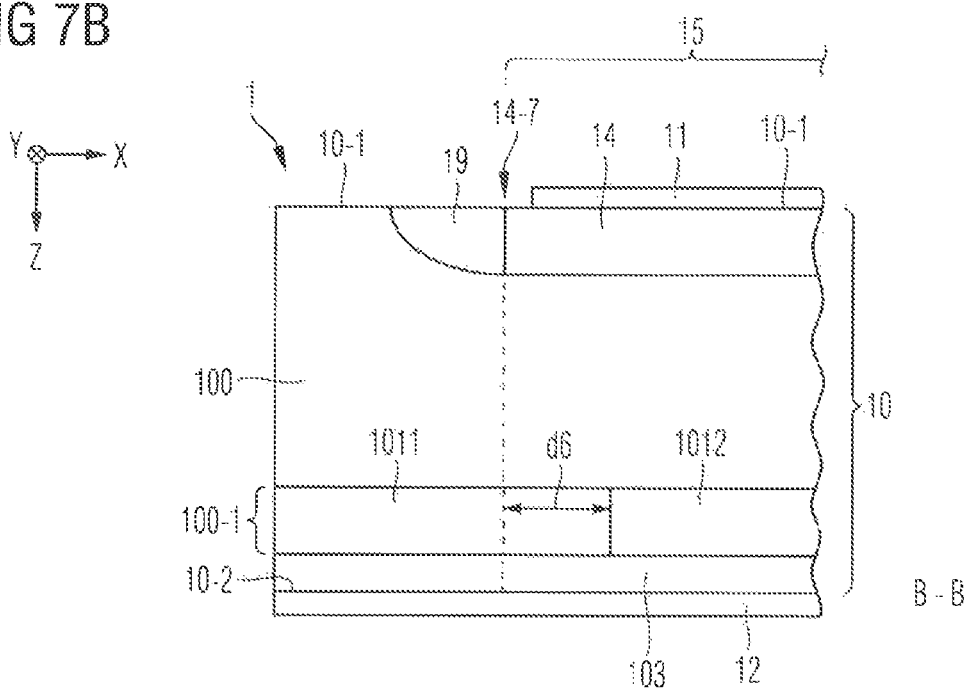
FIG. 7B schematically and exemplarily illustrates a section of another vertical cross-section of the power semiconductor device of FIG. 7A.

In accordance with a further aspect of the invention, as exemplarily illustrated in FIGS. 7A-B, a power semiconductor device 1 comprises a semiconductor body 10 having a front side 10-1 coupled to a first load terminal structure 11 and a backside 10-2 coupled to a second load terminal structure 12. A front side structure 14 is arranged at the front side 10-1 and is at least partially included in the semiconductor body 10. The front side structure 14 defines a front side active region 15 that is configured for conducting a load current between the first load terminal structure 11 and the second load terminal structure 12 in a conducting state of the power semiconductor device 1. The front side structure 14 exhibits a first lateral edge portion 14-1, a second lateral edge portion 14-2, and a first corner portion 14-7 that forms a transition between the first lateral edge portion 14-1 and the second lateral edge portion 14-2. For a definition of the position of said lateral edge portions 14-1, 14-2 and the corner portion 14-7, it is referred to the above.

Further, the power semiconductor device 1 comprises a drift region 100 of a first conductivity type being included in the semiconductor body, and a field stop region 100-1 being included in the drift region 100 and having dopants of the first conductivity type at a higher dopant concentration than the drift region 100 external of the field stop region.

The field stop region 100-1 comprises an inner region 1012 and an outer region 1011. The outer region 1011 is arranged closer to the first lateral edge portion 14-1, the second lateral edge portion 14-2, and the first corner portion 14-7 than the inner region 1012 and has dopants of the first conductivity type at a higher dopant concentration than the inner region 1012. In the vicinity of the first corner portion 14-7, the outer region 1011 extends further into the front side active region 15 than in the vicinity of each of the first lateral edge portion 14-1 and the second lateral edge portion 14-2.

In another variant embodiment, wherein, e.g., the power semiconductor device 1 may be or comprise a diode, the inner region 1012 may have dopants of the first conductivity type at a lower dopant concentration than the inner region 1012. As described previously, in the vicinity of the first corner portion 14-7, the outer region 1011 extends further into the front side active region 15 than in the vicinity of each of the first lateral edge portion 14-1 and the second lateral edge portion 14-2. For example, an emitter efficiency of a cathode emitter of the diode may thus be locally reduced.

In an embodiment, in a vertical projection, an overlap of the front side structure 14 and the inner region 1012 may laterally terminate at a fifth distance d5 from the first lateral edge portion 14-1 and/or the second lateral edge portion 14-2 and at a sixths distance d6 from the first corner portion 14-7, wherein the sixths distance d6 is larger than the fifths distance d5. For example, the sixths distance d6 may be larger than the fifths distance d5 at least by a factor of 1.5, such as at least by a factor of 3 or even a factor of 5.

The aspects regarding a respective extension of the outer region 1011 and the inner region 1012 of the field stop region 100-1 as described above with reference to FIGS. 7A-B may be combined with other aspects of the invention described above and/or below. However, it should be noted that said aspects regarding a respective extension of the outer region 1011 and the inner region 1012 of the field stop region 100-1 represent an independent aspect of the present invention.

In accordance with yet a further aspect of the invention, a power semiconductor device 1 comprises a semiconductor body 10 having a front side 10-1 coupled to a first load terminal structure 11 and a backside 10-2 coupled to a second load terminal structure 12. A front side structure 14 is arranged at the front side 10-1 and is at least partially included in the semiconductor body 10. The front side structure 14 defines a front side active region 15 that is configured for conducting a load current between the first load terminal structure 11 and the second load terminal structure 12 in a conducting state of the power semiconductor device 1. The front side structure 14 exhibits a first lateral edge portion 14-1, a second lateral edge portion 14-2, and a first corner portion 14-7 that forms a transition between the first lateral edge portion 14-1 and the second lateral edge portion 14-2.

The power semiconductor device 1 further comprises a drift region 100 of a first conductivity type, the drift region 100 being included in the semiconductor body 10 and being configured for carrying the load current. A lifetime of charge carriers in the drift region 100 is shorter in the vicinity of the first corner portion 14-7 than in the vicinity of each of the first lateral edge portion 14-1 and the second lateral edge portion 14-2. For example, in order to locally decreasing a charge carrier lifetime, the drift region 100 may comprise one or more recombination regions which comprise recombination centers that are configured for reducing a lifetime of free charge carriers.

In a variant embodiment, alternatively or in addition to said relation of the charge carrier lifetimes in the vicinity of the first corner portion 14-7 and in the vicinity of the lateral edge portions 14-1, 14-2, it may be provided that a charge carrier lifetime in the vicinity of a chip edge (e.g. in an edge termination region) may be shorter than a charge carrier lifetime in a center of the front side active region 15.

Such a local adaptation of a charge carrier lifetime may be combined with one or more aspects of the invention described above or below. However, it should be noted that the local reduction of the lifetime of free charge carriers represents an independent aspect of the invention.

For example, a power semiconductor device 1 according to one or more embodiments as described above may have come into being by means of some or all of the following processing steps:

providing a semiconductor body 10 having a front side 10-1 and a backside 10-2;

forming a front side structure 14 being arranged at the front side 10-1 and being at least partially included in the semiconductor body 10, the front side structure 14 defining a front side active region 15 that is configured for conducting a load current between a first load terminal structure 11 coupled to the front side 10-1 and a second load terminal structure 12 coupled to the backside 10-2 in a conducting state of the power semiconductor device 1, wherein the front side structure 14 exhibits a first lateral edge portion 14-1, a second lateral edge portion 14-2, and a first corner portion 14-7 that forms a transition between the first lateral edge portion 14-1 and the second lateral edge portion 14-2;

providing or forming a drift region 100 of a first conductivity type being included in the semiconductor body 10 and being configured for carrying the load current; and forming a backside emitter region 103 being arranged in the semiconductor body 10 in contact with the second load terminal 12, the emitter region having a net dopant concentration that is higher than a net dopant concentration of the drift region 100;

wherein, in a vertical projection, the backside emitter region 103 laterally terminates at a first distance d1 from the first lateral edge portion 14-1 and/or the second lateral edge portion 14-2 and at a second distance d2 from the first corner portion 14-7, wherein the second distance d2 is larger than the first distance d1.

For example, the processing method described above further comprises forming a recombination region inside the drift region 100, the recombination region comprising recombination centers that are configured for reducing a lifetime of free charge carriers, wherein forming the recombination region comprises at least one of a masked irradiation process and a masked diffusion process. For example, a masked irradiation with helium atoms, protons or electrons may be used to this end, wherein the irradiation may be carried out either from a wafer front side or from a wafer backside. Additionally or alternatively, a heavy metal diffusion (e.g. a platinum, palladium, and/or gold diffusion) may be carried out either from a wafer front side or from a wafer backside. An overlap of a masked region during the irradiation process and/or during the diffusion process and the front side structure 14 may, in a vertical projection, laterally terminate at the first distance d1 from the first lateral edge portion 14-1 and/or the second lateral edge portion 14-2 and at the second distance d2 from the first corner portion 14-7.

In a further embodiment, a method of processing a power semiconductor device 1, comprises:

providing a semiconductor body 10 having a front side 10-1 and a backside 10-2;

forming a front side structure 14 being arranged at the front side 10-1 and being at least partially included in the semiconductor body 10, the front side structure 14 defining a front side active region 15 that is configured for conducting a load current between a first load terminal structure 11 coupled to the front side 10-1 and a second load terminal structure 12 coupled to the backside 10-2 in a conducting state of the power semiconductor device 1, wherein the front side structure 14 exhibits a first lateral edge portion 14-1, a second lateral edge portion 14-2, and a first corner portion 14-7 that forms a transition between the first lateral edge portion 14-1 and the second lateral edge portion 14-2, providing or forming a drift region 100 of a first conductivity type being included in the semiconductor body 10 and being configured for carrying the load current;

forming a backside emitter region 103 being arranged in the semiconductor body 10 in contact with the second load terminal 12, the emitter region having a net dopant concentration that is higher than a net dopant concentration of the drift region 100;

forming a recombination region inside the drift region 100, the recombination region comprising recombination centers that are configured for reducing a lifetime of free charge carriers, wherein forming the recombination region comprises at least one of a masked irradiation process and a masked diffusion process, wherein an overlap of a masked region during the irradiation process and/or during the diffusion process and the front side structure 14, in a vertical projection, laterally terminates at a first distance d1 from the first lateral edge portion 14-1 and/or the second lateral edge portion 14-2 and at a second distance d2 from the first corner portion 14-7. wherein the second distance d2 is larger than the first distance d1.

In a further embodiment, a power semiconductor device comprises:

a semiconductor body having a front side coupled to a first load terminal structure and a backside coupled to a second load terminal structure;

a front side structure arranged at the front side and at least partially included in the semiconductor body, the front side structure defining a front side active region that is configured to conduct a load current between the first load terminal structure and the second load terminal structure in a conducting state of the power semiconductor device, the front side structure comprising a first lateral edge portion, a second lateral edge portion, and a first corner portion that forms a transition between the first lateral edge portion and the second lateral edge portion;

a drift region of a first conductivity type included in the semiconductor body and configured to carry the load current; and a field stop region included in the drift region and having dopants of the first conductivity type at a higher dopant concentration than the drift region external of the field stop region, wherein the field stop region comprises an inner region and an outer region, the outer region being arranged closer to the first lateral edge portion, the second lateral edge portion, and the first corner portion than the inner region, and having dopants of the first conductivity type at a higher dopant concentration than the inner region, wherein, in a vicinity of the first corner portion, the outer region extends further into the front side active region than in a vicinity of each of the first lateral edge portion and the second lateral edge portion.

In a further embodiment, a power semiconductor device comprises:
- a semiconductor body having a front side coupled to a first load terminal structure and a backside coupled to a second load terminal structure;
- a front side structure arranged at the front side and at least partially included in the semiconductor body, the front side structure defining a front side active region configured to conduct a load current between the first load terminal structure and the second load terminal structure in a conducting state of the power semiconductor device, the front side structure comprising a first lateral edge portion, a second lateral edge portion, and a first corner portion that forms a transition between the first lateral edge portion and the second lateral edge portion;
- a drift region of a first conductivity type included in the semiconductor body and configured to carry the load current; and
- a field stop region included in the drift region and having dopants of the first conductivity type at a higher dopant concentration than the drift region external of the field stop region,
- wherein the field stop region comprises an inner region and an outer region, the outer region being arranged closer to the first lateral edge portion, the second lateral edge portion, and the first corner portion than the inner region and having dopants of the first conductivity type at a lower dopant concentration than the inner region,
- wherein, in a vicinity of the first corner portion, the outer region extends further into the front side active region than in a vicinity of each of the first lateral edge portion and the second lateral edge portion.

In a vertical projection, the inner region may laterally terminate at a fifth distance from the first lateral edge portion and/or the second lateral edge portion and at a sixth distance from the first corner portion, the sixth distance being larger than the fifth distance.

Below the first corner portion, the field stop region may comprise dopants providing at least one deep energy level.

The at least one deep energy level maybe situated at distance of at least 160 meV from a conduction band edge.

In the vertical projection, a dopant concentration of dopants of the first conductivity type inside the field stop region may be higher in the vicinity of the corner portion than in a vicinity of each of the first lateral edge portion and the second lateral edge portion.

In the vicinity of the first corner portion, the field stop region may comprise selenium and/or sulfur dopants.

In the vertical projection, a dopant concentration of dopants of the first conductivity type inside the field stop region may be lower in the vicinity of the corner portion than in a vicinity of each of the first lateral edge portion and the second lateral edge portion.

In a further embodiment, a power semiconductor device comprises:
- a semiconductor body having a front side coupled to a first load terminal structure and a backside coupled to a second load terminal structure;
- a front side structure arranged at the front side and at least partially included in the semiconductor body, the front side structure defining a front side active region configured to conduct a load current between the first load terminal structure and the second load terminal structure in a conducting state of the power semiconductor device, the front side structure comprising a first lateral edge portion, a second lateral edge portion, and a first corner portion that forms a transition between the first lateral edge portion and the second lateral edge portion; and
- a drift region of a first conductivity type included in the semiconductor body and configured to carry the load current,
- wherein a lifetime of charge carriers in the drift region is shorter in a vicinity of the first corner portion than in the vicinity of each of the first lateral edge portion and the second lateral edge portion.

In a further embodiment, a power semiconductor device comprises:
- a semiconductor body having a front side coupled to a first load terminal structure and a backside coupled to a second load terminal structure; and
- a front side structure arranged at the front side and at least partially included in the semiconductor body,
- wherein the front side structure comprises an active cell field comprising a plurality of IGBT cells, each IGBT cell comprising a source region of a first conductivity type arranged in contact with the first load terminal structure and a body region of a second conductivity type complementary to the first conductivity type, and
- a drainage structure comprising a plurality of drainage cells, each drainage cell comprising a drainage region of the second conductivity type arranged in contact with the first load terminal structure, each drainage cell being devoid of a source region of the first conductivity type arranged in contact with the first load terminal structure,
- wherein the drainage structure is arranged laterally in between the active cell field and an edge termination region of the semiconductor device,
- wherein the drainage structure comprises a first outer edge portion, a second outer edge portion, and an outer corner portion that forms a transition between the first outer edge portion and the second outer edge portion,
- wherein a minimal distance between the active cell field and the outer corner portion is larger than a minimal distance between the active cell field and each of the first outer edge portion and the second outer edge portion.

In the above, embodiments pertaining to a power semiconductor device, such as a diode, a MOSFET, or an IGBT, and corresponding processing methods were explained. For example, these devices are based on silicon (Si). Accordingly, a monocrystalline semiconductor region or layer, e.g., semiconductor body 10 and its regions/zones such as 100, 100-1, 103, and 105 can be a monocrystalline Si-region or Si-layer. In other embodiments, polycrystalline or amorphous silicon may be employed.

It should, however, be understood that the semiconductor body 10 and its doped regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor device applications currently mainly Si, SiC, GaAs and GaN materials are used.

Spatially relative terms such as "under", "below", "above", "lower", "over", "upper" and the like, are used for ease of description to explain the positioning of one element relative to a second element. These terms are intended to encompass different orientations of the respective device in addition to different orientations than those depicted in the Figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A power semiconductor device, comprising:
a semiconductor body having a front side coupled to a first load terminal structure and a backside coupled to a second load terminal structure;
a front side structure being arranged at the front side and at least partially included in the semiconductor body, the front side structure defining a front side active region configured to conduct a load current between the first load terminal structure and the second load terminal structure in a conducting state of the power semiconductor device, the front side structure comprising a first lateral edge portion, a second lateral edge portion, and a first corner portion forming a transition between the first lateral edge portion and the second lateral edge portion;
a drift region of a first conductivity type included in the semiconductor body and configured to carry the load current; and
a backside emitter region arranged in the semiconductor body in contact with the second load terminal, the backside emitter region having a net dopant concentration that is higher than a net dopant concentration of the drift region, wherein, in a vertical projection, the backside emitter region laterally terminates at a first distance from the first lateral edge portion and/or the second lateral edge portion and at a second distance from the first corner portion, the second distance being larger than the first distance.

2. The power semiconductor device of claim 1, wherein the first distance and the second distance are both positive, and wherein the second distance is at least 1.5 times the first distance.

3. The power semiconductor device of claim 1, wherein a difference in distance between the second distance and the first distance is at least a diffusion length of free charge carriers.

4. The power semiconductor device of claim 1, wherein a difference in distance between the second distance and the first distance is at least half a vertical extension of the drift region.

5. The power semiconductor device of claim 1, wherein the first distance is at least 0.5 times a diffusion length of free charge carriers.

6. The power semiconductor device of claim 1, wherein the first lateral edge portion and the second lateral edge portion are straight edge portions.

7. The power semiconductor device of claim 1, wherein the first lateral edge portion and the second lateral edge portion are in parallel to corresponding lateral chip edges of the semiconductor body.

8. The power semiconductor device of claim 1, wherein the first corner portion is a rounded corner.

9. The power semiconductor device of claim 1, wherein the power semiconductor device is or comprises a diode.

10. The power semiconductor device of claim 9, wherein the front side structure is an anode region of a second conductivity type complementary to the first conductivity type, the anode region being included in the semiconductor body.

11. The power semiconductor device of claim 9, wherein the backside emitter region is a cathode region of the first conductivity type.

12. The power semiconductor device of claim 1, wherein the power semiconductor device is or comprises an IGBT.

13. The power semiconductor device of claim 12, wherein the front side structure is a cell field comprising a plurality of IGBT cells.

14. The power semiconductor device of claim 13, wherein the cell field comprises a plurality of trenches, which are in each case separated from a respective neighboring trench of the cell field by a semiconductor mesa region, and wherein a lateral extension of the semiconductor mesa regions in a vicinity of an outer edge of the cell field is larger than a lateral extension of semiconductor mesa regions in a central portion of the cell field.

15. The power semiconductor device of claim 13, wherein the cell field comprises a plurality of trenches, which are in each case separated from a respective neighboring trench of the cell field by a semiconductor mesa region, and wherein a lateral extension of the semiconductor mesa regions in a vicinity of the first corner portion is larger than a lateral extension of semiconductor mesa regions in a vicinity of the first and/or second lateral edge portion.

16. The power semiconductor device of claim 12, wherein the backside emitter region is of a second conductivity type that is complementary to the first conductivity type.

17. The power semiconductor device of claim 16, further comprising a second backside region of the second conductivity type, the second backside region being arranged in contact with the second load terminal and having a net dopant concentration of the second conductivity type that is lower than the net dopant concentration of the second conductivity type of the backside emitter region.

18. A power semiconductor device, comprising:
- a semiconductor body having a front side coupled to a first load terminal structure and a backside coupled to a second load terminal structure;
- a front side structure arranged at the front side and at least partially included in the semiconductor body, the front side structure comprising a cell field having a plurality of IGBT cells which define a front side active region that is configured to conduct a load current between the first load terminal structure and the second load terminal structure in a conducting state of the power semiconductor device,
- the front side structure having:
  - a recess defining a pad region for providing a contact pad at the front side;
  - a third lateral edge portion extending alongside the pad region;
  - a fourth lateral edge portion extending alongside the pad region; and
  - a second corner portion that forms a transition between the third lateral edge portion and the fourth lateral edge portion;
- a drift region of a first conductivity type included in the semiconductor body and configured to carry the load current; and
- a backside emitter region arranged in the semiconductor body in contact with the second load terminal, the backside emitter region having a net dopant concentration that is higher than a net dopant concentration of the drift region,
- wherein, in a vertical projection, an overlap of the pad region and the backside emitter region laterally terminates at a third distance from the third lateral edge portion and/or the fourth lateral edge portion and at a fourth distance from the second corner portion, the fourth distance being larger than the third distance.

19. The power semiconductor device of claim 18, wherein the third lateral edge portion and the fourth lateral edge portion are in parallel to corresponding lateral edges of a gate pad arranged inside the pad region at the front side of the semiconductor body.

* * * * *